United States Patent
Hwang et al.

(10) Patent No.: US 11,538,807 B2
(45) Date of Patent: Dec. 27, 2022

(54) METHOD FOR FABRICATING A SEMICONDUCTOR DEVICE INCLUDING A GATE STRUCTURE WITH AN INCLINED SIDE WALL

(71) Applicant: SAMSUNG ELECTRONICS CO., LTD., Suwon-si (KR)

(72) Inventors: Eui Chul Hwang, Seoul (KR); Ju Youn Kim, Suwon-si (KR); Hyung Joo Na, Seoul (KR); Bong Seok Suh, Seoul (KR); Sang Min Yoo, Suwon-si (KR); Joo Ho Jung, Suwon-si (KR); Sung Moon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/318,133

(22) Filed: May 12, 2021

(65) Prior Publication Data
US 2021/0265351 A1    Aug. 26, 2021

Related U.S. Application Data

(62) Division of application No. 16/368,990, filed on Mar. 29, 2019, now Pat. No. 11,011,519.

(30) Foreign Application Priority Data

Jul. 31, 2018 (KR) .......................... 10-2018-0089202

(51) Int. Cl.
*H01L 27/092* (2006.01)
*H01L 27/02* (2006.01)
(Continued)

(52) U.S. Cl.
CPC .... *H01L 27/0924* (2013.01); *H01L 21/30604* (2013.01); *H01L 21/31111* (2013.01);
(Continued)

(58) Field of Classification Search
CPC .......... H01L 27/0924; H01L 29/66545; H01L 29/7846; H01L 27/0207
(Continued)

(56) References Cited

U.S. PATENT DOCUMENTS 6,222,210 B1    4/2001   Cerny et al.
9,368,496 B1    6/2016   Yu et al.
(Continued)

*Primary Examiner* — Quoc D Hoang
(74) *Attorney, Agent, or Firm* — Lee IP Law, P.C.

(57) ABSTRACT

A semiconductor device and a method for fabricating the same, the device including an active pattern extending in a first direction on a substrate; a field insulating film surrounding a part of the active pattern; a first gate structure extending in a second direction on the active pattern and the field insulating film, a second gate structure spaced apart from the first gate structure and extending in the second direction on the active pattern and the field insulating film; and a first device isolation film between the first and second gate structure, wherein a side wall of the first gate structure facing the first device isolation film includes an inclined surface having an acute angle with respect to an upper surface of the active pattern, and a lowermost surface of the
(Continued)

first device isolation film is lower than or substantially coplanar with an uppermost surface of the field insulating film.

10 Claims, 30 Drawing Sheets

(51) Int. Cl.
| | |
|---|---|
| H01L 29/423 | (2006.01) |
| H01L 29/08 | (2006.01) |
| H01L 21/8234 | (2006.01) |
| H01L 21/311 | (2006.01) |
| H01L 21/306 | (2006.01) |
| H01L 21/762 | (2006.01) |
| H01L 29/66 | (2006.01) |

(52) U.S. Cl.
CPC .. *H01L 21/31144* (2013.01); *H01L 21/76224* (2013.01); *H01L 21/823431* (2013.01); *H01L 21/823437* (2013.01); *H01L 21/823481* (2013.01); *H01L 27/0207* (2013.01); *H01L 29/0847* (2013.01); *H01L 29/42376* (2013.01); *H01L 29/66545* (2013.01)

(58) Field of Classification Search
USPC .......................................................... 257/369
See application file for complete search history.

(56) References Cited

U.S. PATENT DOCUMENTS

| | | | |
|---|---|---|---|
| 9,412,616 B1* | 8/2016 | Xie | ................. H01L 21/823431 |
| 9,564,369 B1 | 2/2017 | Kim et al. | |
| 9,653,583 B1 | 5/2017 | Zhao et al. | |
| 9,935,104 B1 | 4/2018 | Wang et al. | |
| 10,128,240 B2 | 11/2018 | Min et al. | |
| 2016/0240624 A1 | 8/2016 | Zhu | |
| 2016/0247728 A1 | 8/2016 | You et al. | |
| 2017/0365674 A1 | 12/2017 | Lee et al. | |
| 2017/0373144 A1 | 12/2017 | Pandey | |
| 2018/0033699 A1* | 2/2018 | Zhu | ................... H01L 21/76232 |
| 2018/0308956 A1* | 10/2018 | Chang | ................. H01L 29/7851 |

* cited by examiner

METHOD FOR FABRICATING A SEMICONDUCTOR DEVICE INCLUDING A GATE STRUCTURE WITH AN INCLINED SIDE WALL

CROSS-REFERENCE TO RELATED APPLICATIONS

This is a divisional application based on pending application Ser. No. 16/368,990, filed Mar. 29, 2019, the entire contents of which is hereby incorporated by reference.

Korean Patent Application No. 10-2018-0089202, filed on Jul. 31, 2018, in the Korean Intellectual Property Office, and entitled: "Semiconductor Device and Method for Fabricating the Same," is incorporated by reference herein in its entirety.

BACKGROUND

1. Field

Embodiments relate to a semiconductor device and a method for fabricating the same.

2. Description of the Related Art

As a scaling technique for increasing the density of the semiconductor device, a multi-gate transistor in which a multi-channel active pattern (or a silicon body) having a fin or nanowire shape may be formed on a substrate and a gate may be formed on a surface of the multi-channel active pattern.

SUMMARY

The embodiments may be realized by providing a semiconductor device including a substrate; an active pattern extending in a first direction on the substrate; a field insulating film surrounding a part of a side wall of the active pattern; a first gate structure extending in a second direction on the active pattern and the field insulating film, the second direction intersecting the first direction; a second gate structure spaced apart from the first gate structure and extending in the second direction on the active pattern and the field insulating film; and a first device isolation film between the first gate structure and the second gate structure, wherein a side wall of the first gate structure facing the first device isolation film includes a first inclined surface having an acute angle with respect to an upper surface of the active pattern, and a lowermost surface of the first device isolation film is lower than or substantially coplanar with an uppermost surface of the field insulating film.

The embodiments may be realized by providing a semiconductor device including a substrate; an active pattern including a separation trench on the substrate; a device isolation film filling the separation trench; a source/drain region in the active pattern; and a gate structure intersecting the active pattern on the active pattern between the device isolation film and the source/drain region, wherein a side wall of the gate structure facing the device isolation film includes a first inclined surface having an acute angle with respect to an upper surface of the active pattern.

The embodiments may be realized by providing a semiconductor device including a substrate including a first region and a second region; a first active pattern including a first separation trench and extending in a first direction on the first region of the substrate; a second active pattern extending in the first direction on the second region of the substrate; a first gate structure extending in a second direction on the first active pattern and the second active pattern, the second direction intersecting the first direction; a second gate structure spaced apart from the first gate structure and extending in the second direction on the first active pattern and the second active pattern; and a device isolation film filling the first separation trench and extending in the second direction between the first gate structure and the second gate structure, wherein a side wall of the first gate structure facing the device isolation film includes a first inclined surface having an acute angle with respect to an upper surface of the first active pattern.

The embodiments may be realized by providing a semiconductor device including a substrate; a first fin type pattern extending in a first direction on the substrate; a second fin type pattern spaced apart from the first fin type pattern in the first direction and extending in the first direction on the substrate; a field insulating film that separates the first fin type pattern and the second fin type pattern and includes a separation trench therein; a first gate structure and a second gate structure on both sides of the separation trench and extending in a second direction intersecting the first direction, respectively; and a device isolation film that fills the separation trench between the first gate structure and the second gate structure.

The embodiments may be realized by providing a method for fabricating a semiconductor device, the method including forming an active pattern extending in a first direction on a substrate, forming a plurality of dummy gate electrodes spaced apart from each other and extending in a second direction intersecting the first direction, on the active pattern, forming an interlayer insulating film that covers side walls of the respective dummy gate electrodes; forming a first gate structure and a second gate structure, each extending in the second direction, in place of a plurality of the dummy gate electrodes, after forming the interlayer insulating film; etching the interlayer insulating film and the active pattern between the first gate structure and the second gate structure to form a separation trench; and forming a device isolation film which fills the separation trench.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
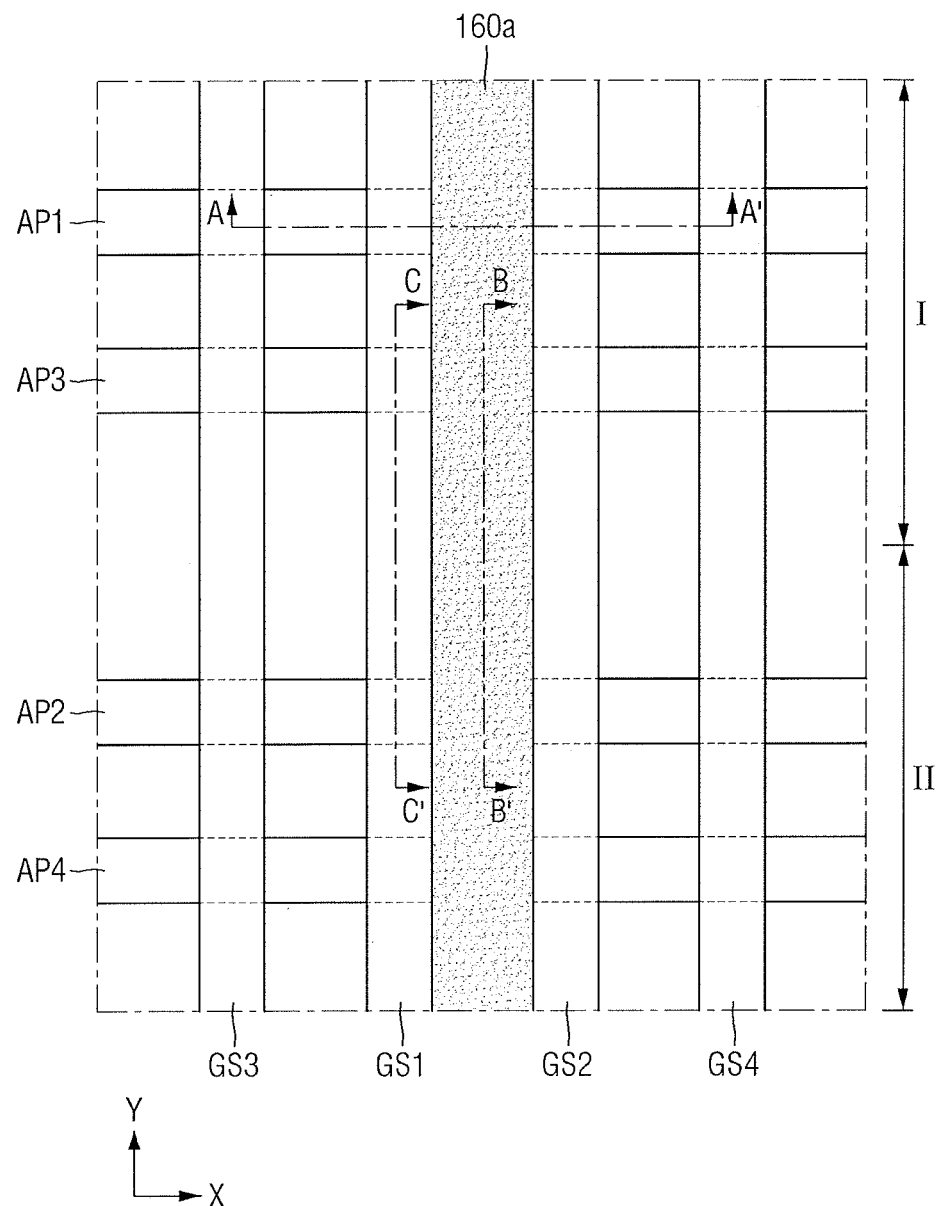
FIG. 1 illustrates a schematic layout diagram of a semiconductor device according to some embodiments.

Hereinafter, a semiconductor device according to some embodiments will be described with reference to FIGS. 1 to 25.

In the drawings of the semiconductor device according to some embodiments, a fin type transistor (FinFET) including a channel region of a fin type pattern shape is exemplarily illustrated. The semiconductor device according to some embodiments may, e.g., include a tunneling transistor (tunneling FET), a transistor including a nanowire, a transistor including a nanosheet or a three-dimensional (3D) transistor. In addition, the semiconductor device according to some embodiments may include a bipolar junction transistor, a lateral double diffused transistor (LDMOS) or the like.

Figure 2:
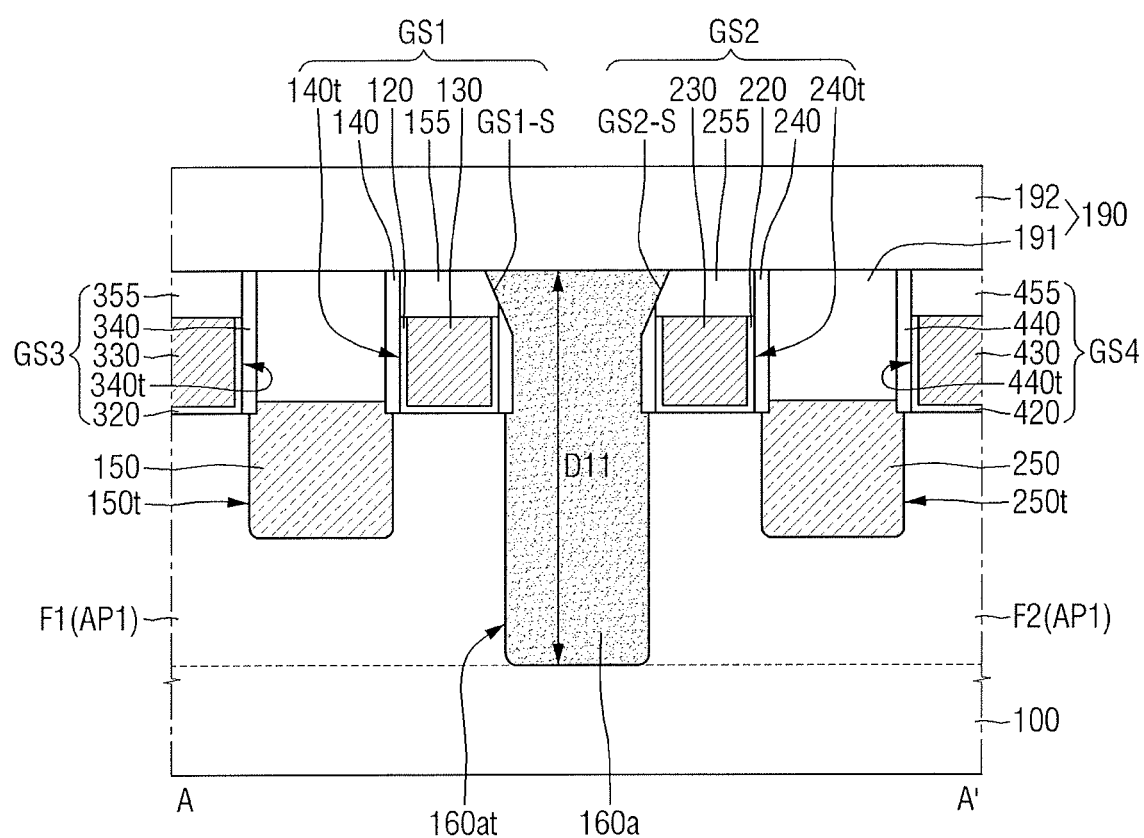
FIG. 2 illustrates a cross-sectional view taken along line A-A' of FIG. 1.
Figure 3:
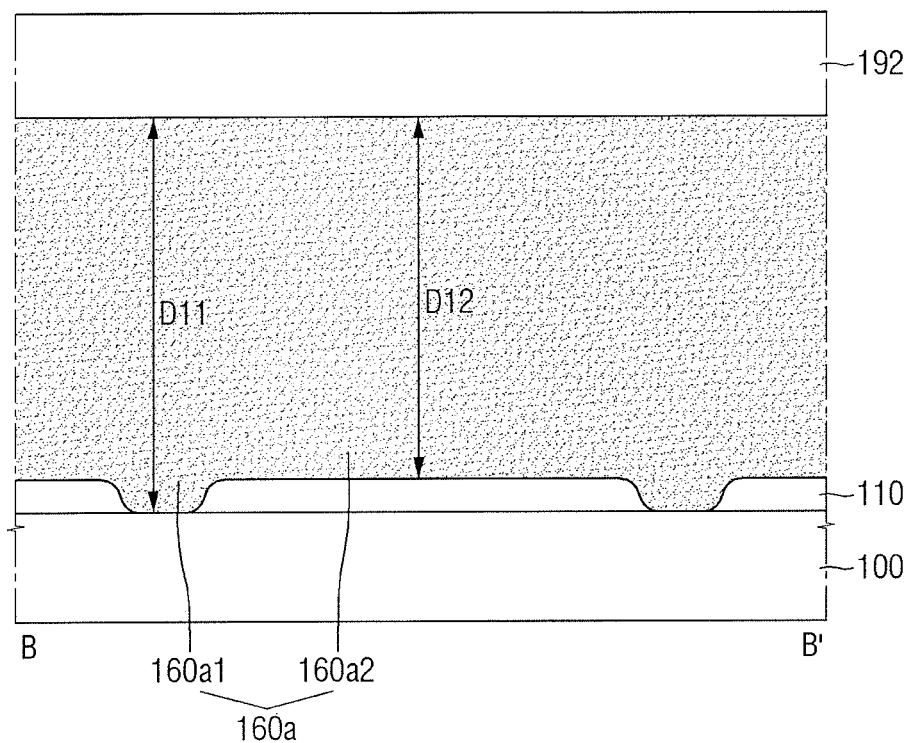
FIG. 3 illustrates a cross-sectional view taken along line B-B' of FIG. 1.
Figure 4:
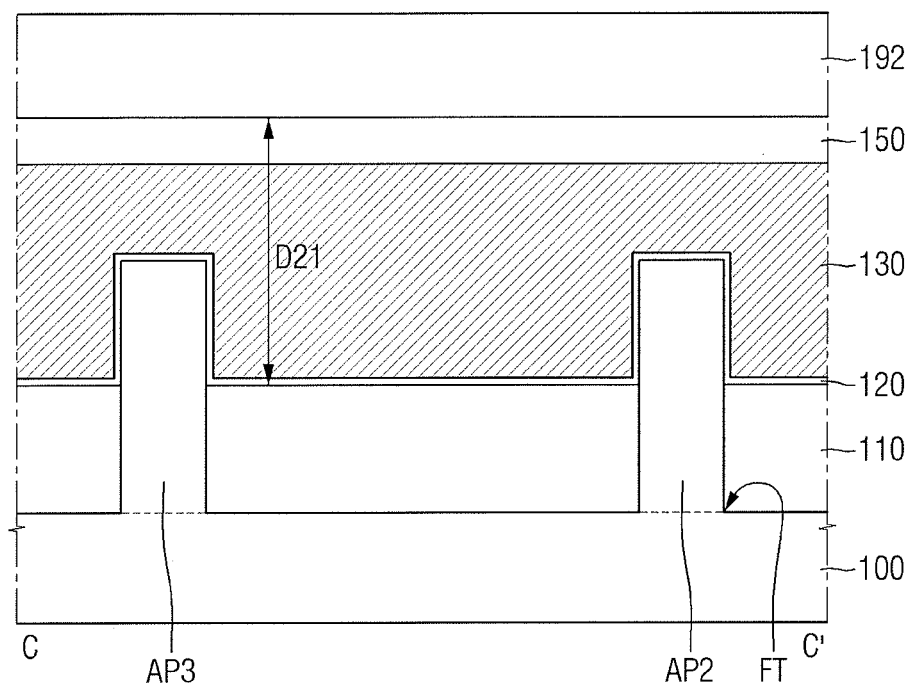
FIG. 4 illustrates a cross-sectional view taken along line C-C' of FIG. 1.

FIG. 1 illustrates a schematic layout diagram of a semiconductor device according to some embodiments. FIG. 2 illustrates a cross-sectional view taken along line A-A' of FIG. 1. FIG. 3 illustrates a cross-sectional view taken along line B-B' of FIG. 1. FIG. 4 illustrates a cross-sectional view taken along line C-C' of FIG. 1. For convenience of explanation, a first interlayer insulating film 191 and a second interlayer insulating film 192 are not illustrated in FIG. 1.

Referring to FIGS. 1 to 4, the semiconductor device according to some embodiments may include first to fourth active patterns AP1, AP2, AP3 and AP4, a field insulating film 110, first to fourth gate structures GS1, GS2, GS3 and GS4, a first source/drain region 150, a second source/drain region 250, a first interlayer insulating film 191, a first device isolation film 160a, and a second interlayer insulating film 192.

The substrate 100 may be bulk silicon or silicon-on-insulator (SOI). In an implementation, the substrate 100 may be a silicon substrate and may include other materials, e.g., silicon germanium, silicon germanium on insulator (SGOI), indium antimonide, lead tellurium compound, indium arsenide, phosphide indium, gallium arsenide or gallium antimonide.

The substrate 100 may include a first region I and a second region II. In an implementation, the first region I and the second region II may be regions spaced apart from each other, or may be regions connected to each other. In the first region I and the second region II, semiconductor elements of the same conductivity type may be formed, and semiconductor elements of different conductivity types may be formed. Hereinafter, the first region I is described as a PMOS region and the second region II is described as an NMOS region.

Each of the first to fourth active patterns AP1, AP2, AP3 and AP4 may protrude from the substrate 100. Each of the first to fourth active patterns AP1, AP2, AP3 and AP4 may extend long along a first direction X on the substrate 100. For example, each of the first to fourth active patterns AP1, AP2, AP3 and AP4 may include a long side extending in the first direction X, and a short side extending in a second direction Y. Furthermore, each of the first to fourth active patterns AP1, AP2, AP3 and AP4 may be defined by a fin trench FT. For example, as illustrated in FIG. 4, each of the third and second activity patterns AP3 and AP2 may be defined by the fin trench FT.

The first to fourth active patterns AP1, AP2, AP3 and AP4 may be a part of the substrate 100 and may include an epitaxial layer grown from the substrate 100. Each of the first to fourth active patterns AP1, AP2, AP3 and AP4 may include silicon or germanium, which is an elemental semiconductor material. In an implementation, the first to fourth active patterns AP1, AP2, AP3 and AP4 may include compound semiconductors, and may include, e.g., a group IV-IV compound semiconductor or a group III-V compound semiconductor.

In the following description, the first and third active patterns AP1 and AP3 will be described as being formed on the first region I of the substrate 100, and the second and fourth active patterns AP2 and AP4 will be described as being formed on the second region II of the substrate 100.

The field insulating film 110 may be formed on the substrate 100. The field insulating film 110 may fill at least a part of the fin trench FT. As a result, the field insulating film 110 may surround at least some parts of side walls of each of the first to fourth active patterns AP1, AP2, AP3 and AP4.

In an implementation, the upper surfaces of the first to fourth active patterns AP1, AP2, AP3 and AP4 may protrude upward from the upper surface of the field insulating film 110. For example, as illustrated in FIG. 4, the field insulating film 110 may surround some parts of the side walls of each of the third and second active patterns AP3 and AP2.

The first to fourth gate structures GS1, GS2, GS3 and GS4 may be formed on the first to fourth active patterns AP1, AP2, AP3 and AP4 and the field insulating film 110. In addition, the first to fourth gate structures GS1, GS2, GS3 and GS4 may extend in the second direction Y. As a result, each of the first to fourth gate structures GS1, GS2, GS3 and GS4 may intersect the first to fourth active patterns AP1, AP2, AP3 and AP4.

Each of the first to fourth gate structures GS1, GS2, GS3 and GS4 may include gate insulating films 120, 220, 320 and 420, gate electrodes 130, 230, 330 and 430, gate spacers 140, 240, 340 and 440, gate trenches 140*t*, 240*t*, 340*t* and 440*t* defined by the gate spacers 140, 240, 340 and 440, and capping patterns 155, 255, 355 and 455.

The first to fourth gate insulating films 120, 220, 320 and 420 may be interposed between the first to fourth active patterns AP1, AP2, AP3 and AP4 and the respective gate electrodes 130, 230, 330 and 430, respectively. In an implementation, each of the first to fourth gate insulating films 120, 220, 320 and 420 may extend along the side walls and lower surfaces of each of the gate trenches 140t, 240t, 340t and 440t.

The first to fourth gate insulating films 120, 220, 320, and 420 may include, e.g., a high dielectric constant insulating film. The high dielectric constant insulating film may include a high dielectric material having a dielectric constant higher than that of the silicon oxide film.

Each of the first to fourth gate electrodes 130, 230, 330 and 430 may be formed on the first to fourth gate insulating films 120, 220, 320 and 420, respectively. In addition, the first to fourth gate electrodes 130, 230, 330 and 430 may fill at least some parts of the gate trenches 140t, 240t, 340t and 440t, respectively.

The first to fourth gate electrodes 130, 230, 330 and 430 may include, e.g., Ti, Ta, W, Al, Co or combinations thereof. In an implementation, the first to fourth gate electrodes 130, 230, 330 and 430 may be made of silicon, silicon germanium, or the like, instead of metal.

Each of the first to fourth gate spacers 140, 240, 340 and 440 may be formed on side walls of each of the first to fourth gate electrodes 130, 230, 330 and 430.

The first to fourth gate spacers 140, 240, 340 and 440 may include, e.g., silicon nitride (SiN), silicon oxynitride (SiON), silicon oxide (SiO$_2$), silicon oxycarbonitride (SiOCN) or combinations thereof.

The first to fourth capping patterns 155, 255, 355 and 455 may be formed on the respective gate electrodes 130, 230, 330 and 430.

Each of the first to fourth capping patterns 155, 255, 355 and 455 may include, e.g., silicon oxide (SiO$_2$), silicon nitride (SiN), silicon oxynitride (SiON), silicon carbonitride (SiCN), silicon oxycarbonitride (SiOCN), or combinations thereof.

In an implementation, the first to fourth capping patterns 155, 255, 355 and 455 may also be omitted.

In an implementation, the first to fourth gate spacers 140, 240, 340 and 440 may be formed on the side walls of the respective first to fourth gate electrodes 130, 230, 330 and 430 and the side walls of the respective first to fourth capping patterns 155, 255, 355 and 455. For example, as illustrated in FIG. 2, each of the first to fourth gate electrodes 130, 230, 330 and 430 fills some part of each of the gate trenches 140t, 240t, 340t and 440t, and the first to fourth capping patterns 155, 255, 355 and 455 may fill the remaining parts of each of the gate trenches 140t, 240t, 340t and 440t.

The first and second source/drain regions 150 and 250 may be formed in the first active pattern AP1. For example, as illustrated in FIG. 2, the first source/drain region 150 may be formed in the first active pattern AP1 between the first gate structure GS1 and the third gate structure GS3, and the second source/drain region 250 may be formed in the first active pattern AP1 between the second gate structure GS2 and the fourth gate structure GS4.

The first and second source/drain regions 150 and 250 may include an epitaxial layer formed on the first active pattern AP1. For example, the first source/drain region 150 may be an epitaxial pattern that fills the first source/drain trench 150t formed in the first active pattern AP1, and the second source/250 may be an epitaxial pattern that fills the second source/drain trench 250t formed in the second active pattern AP1. In an implementation, the first and second source/drain regions 150 and 250 may be impurity regions formed in the first active pattern AP1.

In an implementation, the first and second source/drain regions 150 and 250 may be elevated source/drain regions including an upper surface that protrudes upwardly (e.g., away from the substrate) from the upper surface of the first active pattern AP1.

In an implementation, the first and second source/drain regions 150 and 250 may include undercuts at the lower ends of the first to fourth gate structures GS1, GS2, GS3 and GS4. This may be attributed to the characteristics of the etching process for forming the first and second source/drain trenches 150t and 250t. In an implementation, the first and second source/drain regions 150 and 250 may not include undercuts.

The first interlayer insulating film 191 may be formed on the field insulating film 110 and the first and second source/drain regions 150 and 250. In addition, the first interlayer insulating film 191 may cover the side walls of the first to fourth gate structures GS1, GS2, GS3, and GS4.

In an implementation, the first interlayer insulating film 191 may further include an etching prevention film extending along the upper surfaces of the first and second source/drain regions 150 and 250.

In an implementation, the upper surface of the first interlayer insulating film 191 may be on substantially the same plane as the upper surfaces of the first to fourth capping patterns 155, 255, 355 and 455. In the present specification, "substantially the same" means not only completely the same thing but also a fine difference which may occur due to a process margin or the like.

The first device isolation film 160a may be between the first gate structure GS1 and the second gate structure GS2. The first device isolation film 160a may fill a first separation trench 160at in the first active pattern AP1. The first separation trench 160at may be formed in the first active pattern AP1 between the first gate structure GS1 and the second gate structure GS2. In addition, the first device isolation film 160a may extend in the second direction Y. For example, the first separation trench 160at may extend in the second direction Y.

The upper surface of the first device isolation film 160a may be on substantially the same plane as the upper surface of the first interlayer insulating film 191. In an implementation, the upper surface of the first device isolation film 160a may be on substantially the same plane as the upper surfaces of the first to fourth gate structures GS1, GS2, GS3 and GS4. For example, the upper surface of the first device isolation film 160a may be on substantially the same plane as the upper surfaces of the first to fourth capping patterns 155, 255, 355 and 455.

A lowermost surface of the first device isolation film 160a may be lower (e.g., closer to the substrate 100) than or equal to (e.g., aligned or coplanar with) an uppermost surface of the field insulating film 110. For example, a distance (D11 of FIG. 2) from the lower surface of the second interlayer insulating film 192 to the lowermost surface of the first device isolation film 160a may be greater than a distance (D21 of FIG. 4) from the lower surface of the second interlayer insulating film 192 to the uppermost surface of the field insulating film 110.

In an implementation, the first device isolation film 160a may include an undercut formed at the lower ends of the first and second gate structures GS1 and GS2. This may be attributed to the characteristics of the etching process for forming the first separation trench 160*at*. In an implementation, the first device isolation film 160*a* may not include an undercut.

In an implementation, the first device isolation film 160*a* may separate the first active pattern AP1. For example, as illustrated in FIG. 2, the lowermost surface of the first device isolation film 160*a* may be lower than or equal to (e.g., may be aligned with or contact) the upper surface of the substrate 100 (or the lower surface of the field insulating film 110 of FIGS. 3 and 4). Accordingly, the first active pattern AP1 may include a first fin type pattern F1 and a second fin type pattern F2 separated by the first device isolation film 160*a*. The first fin type pattern F1 and the second fin type pattern F2 may be arranged (e.g., spaced apart) along the first direction X and may extend in the first direction X, respectively.

The side wall of the first gate structure GS1 and/or the side wall of the second gate structure GS2 facing the first device isolation film 160*a* may include an inclined surface having an acute angle with respect to the upper surface of the first active pattern AP1. For example, as illustrated in FIG. 2, the side wall of the first gate structure GS1 facing the first device isolation film 160*a* may include a first inclined surface GS1-S, and the side wall of the second gate structure GS2 facing the first device isolation film 160*a* may include a second inclined surface.

In an implementation, as illustrated in FIG. 2, both the first gate structure GS1 and the second gate structure GS2 include the inclined surfaces. In an implementation, only the first gate structure GS1 may include a first inclined surface GS1-S, and the second gate structure GS2 may not include a second inclined surface GS2-S. In an implementation, only the second gate structure GS2 may include a second inclined surface GS2-S, and the first gate structure GS1 may not include the first inclined surface GS1-S. The description of the second inclined surface GS2-S is similar to that of the first inclined surface GS1-S, and the first inclined surface GS1-S will be mainly described below.

The first inclined surface GS1-S may be formed by an etching process for forming the first separation trench 160*at*. For example, when the first gate structure GS1 is exposed by an opening O of a mask pattern (180 of FIG. 30) described below, not only the first interlayer insulating film 191 and the first active pattern AP1, but also a part of the first gate structure GS1 may be etched.

In an implementation, the first inclined surface GS1-S may be in direct contact with the first device isolation film 160*a*. As a result, a part of the side wall of the first device isolation film 160*a* may be defined by the first inclined surface GS1-S.

In an implementation, the first gate spacer 140 may define at least a part of the first inclined surface GS1-S. For example, as illustrated in FIG. 2, the first inclined surface GS1-S may be defined by the side wall of the first gate spacer 140 and the side wall of the first capping pattern 155. This may be attributed to the size of the opening O of a mask pattern (180 of FIG. 30) described below. For example, when the first capping pattern 155 is exposed by the opening O of the mask pattern 180, the first inclined surface GS1-S may be defined by the first gate spacer 140 and the first capping pattern 155.

In an implementation, the first inclined surface GS1-S may be defined only by the first gate spacer 140. For example, when the first capping pattern 155 is not exposed by the opening O of the mask pattern (180 of FIG. 30), the first inclined surface GS1-S may be defined only by the first gate spacer 140.

In an implementation, the first inclined surface GS1-S may be defined by the first capping pattern 155 and the first gate electrode 130. For example, not only the first capping pattern 155 and the first gate spacer 140 but also a part of the first gate electrode 130 may be etched by the etching process which uses the mask pattern (180 of FIG. 30). In such a case, the first gate electrode 130 may be in direct contact with the first device isolation film 160*a*.

In an implementation, a part of the first device isolation film 160*a* may overlap the field insulating film 110. For example, as illustrated in FIG. 3, the first device isolation film 160*a* may include a first portion 160*a*1 that does not overlap the field insulating film 110, and a second portion 160*a*2 that does overlap the field insulating film 110. The first portion 160*a*1 of the field insulating film 110 may be a portion formed in the first to fourth active patterns AP1, AP2, AP3 and AP4.

In an implementation, the lower surface of the first portion 160*a*1 of the first device isolation film 160*a* may be lower (e.g., closer to the substrate 100) than the lower surface of the second portion 160*a*2 of the first device isolation film 160*a*. For example, a distance (D11 of FIG. 3) from the lower surface of the second interlayer insulating film 192 to the lower surface of the first portion 160*a*1 of the first device isolation film 160*a* may be greater than a distance (D12 of FIG. 3) from the lower surface of the second interlayer insulating film 192 to the lower surface of the second portion 160*a*2 of the first device isolation film 160*a*.

The first device isolation film 160*a* may include, e.g., silicon nitride, silicon oxide, silicon carbide, silicon carbonitride, silicon oxycarbide, silicon oxynitride, silicon oxycarbonitride, aluminum oxide, or combinations thereof. In an implementation, the first device isolation film 160*a* may be a single film. In an implementation, the first device isolation film 160*a* may be multiple films.

The second interlayer insulating film 192 may be formed on the first to fourth gate structures GS1, GS2, GS3 and GS4, the first interlayer insulating film 191 and the first device isolation film 160*a*. Thus, the first device isolation film 160*a* may extend from the lower surface of the first separation trench 160*at* to the lower surface of the second interlayer insulating film 192. The interlayer insulating film 190 may include a first interlayer insulating film 191 and a second interlayer insulating film 192.

The first interlayer insulating film 191 and the second interlayer insulating film 192 may include, e.g., a low dielectric constant insulating film. The low dielectric constant insulating film may include a low dielectric material having a dielectric constant lower than that of the silicon oxide film.

Figure 5:
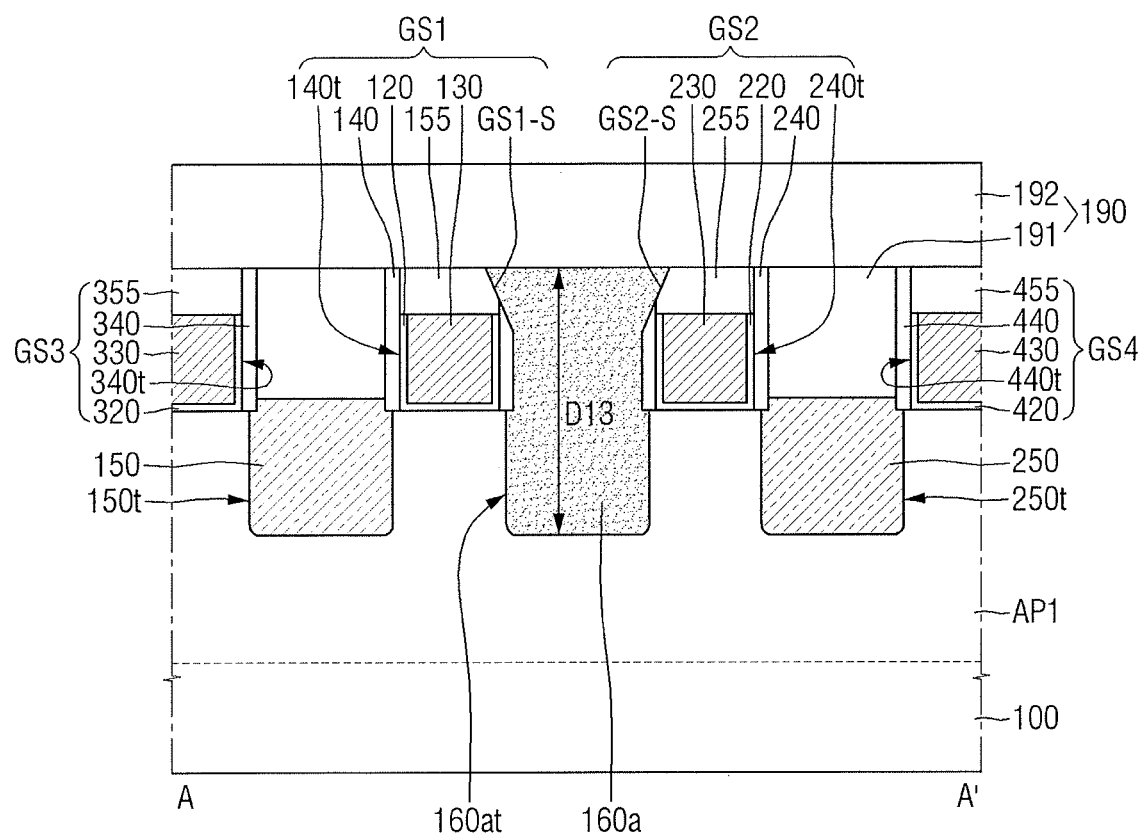
FIGS. 5 and 6 illustrate cross-sectional views of the semiconductor device according to some embodiments.
Figure 6:
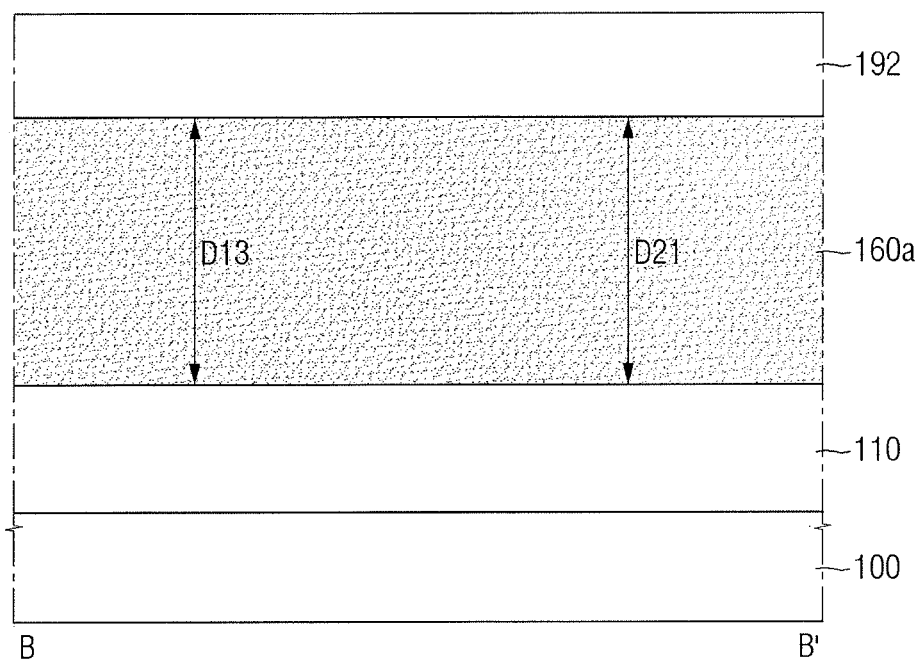

FIGS. 5 and 6 illustrate cross-sectional views of the semiconductor device according to some embodiments. For the sake of convenience of explanation, the repeated contents of parts described with reference to FIGS. 1 to 4 may be briefly described or omitted.

Referring to FIGS. 5 and 6, in the semiconductor device according to some embodiments, the lowermost (e.g., substrate 100 facing) surface of the first device isolation film 160*a* may be higher than the upper surface of the substrate 100 (or the lower surface of the field insulating film 110).

For example, a distance (D13 of FIG. 5) from the lower surface of the second interlayer insulating film 192 to the lowermost surface of the first device isolation film 160*a* may be smaller than a distance from the lower surface of the second interlayer insulating film 192 to the upper surface of the substrate 100 (or the lower surface of the field insulating film 110).

In an implementation, as illustrated in FIG. 6, a distance (D13 of FIG. 6) from the lower surface of the second interlayer insulating film 192 to the lowermost surface of the first device isolation film 160a may be substantially the same as a distance (D21 of FIG. 6) from the lower surface of the second interlayer insulating film 192 to the upper surface of the field insulating film 110. In an implementation, the lowermost surface of the first device isolation film 160a may be between the upper surface of the substrate 100 and the uppermost surface of the field insulating film 110.

Figure 7:
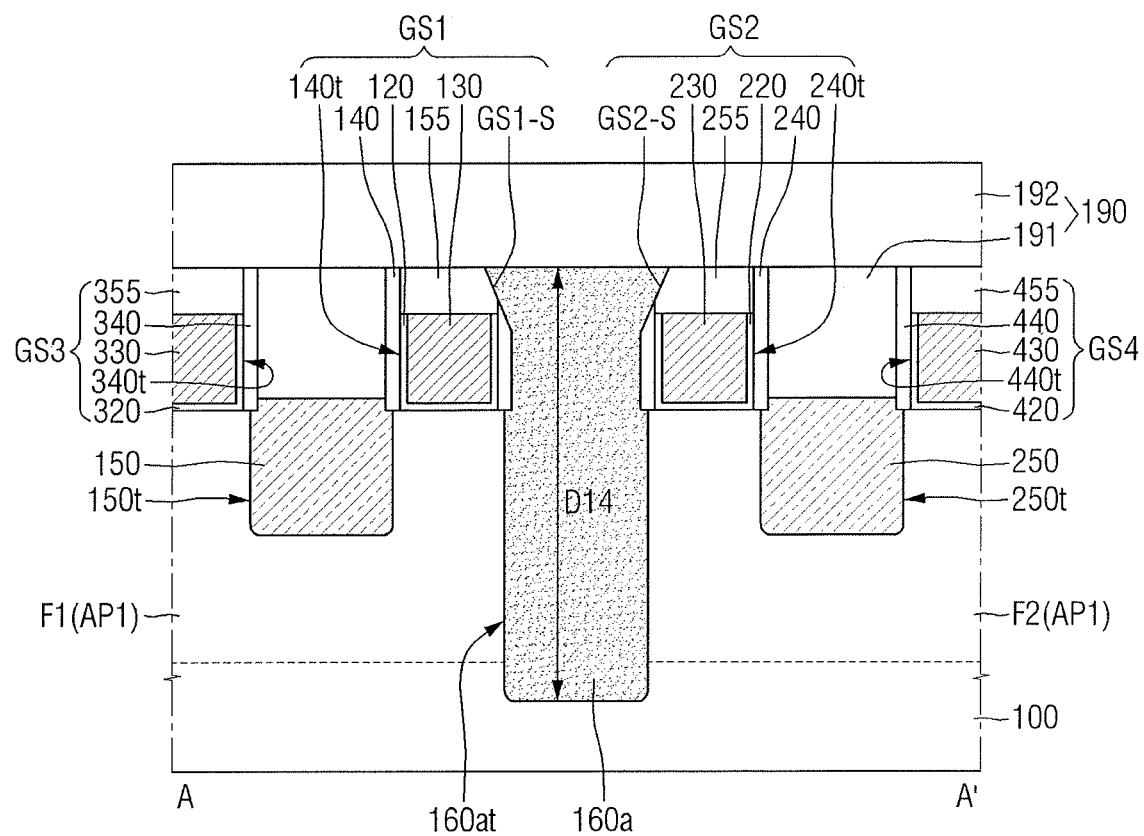
FIG. 7 illustrates a cross-sectional view of the semiconductor device according to some embodiments.

FIG. 7 illustrates a cross-sectional view of the semiconductor device according to some embodiments. For the sake of convenience of explanation, repeated contents of parts described with reference to FIGS. 1 to 4 may be briefly described or omitted.

Referring to FIG. 7, in the semiconductor device according to some embodiments, the lowermost surface of the first device isolation film 160a may be lower than the uppermost surface of the substrate 100 (or the lower surface of the field insulating film 110).

For example, a distance (D14 of FIG. 7) from the lower surface of the second interlayer insulating film 192 to the lowermost surface of the first device isolation film 160a may be greater than a distance from the lower surface of the second interlayer insulating film 192 to the uppermost surface of the substrate 100 (or the lower surface of the field insulating film 110).

For example, the first device isolation film 160a may separate the first active pattern AP1. For example, the first active pattern AP1 may include a first fin type pattern F1 and a second fin type pattern F2 separated by the first device isolation film 160a.

Figure 8:
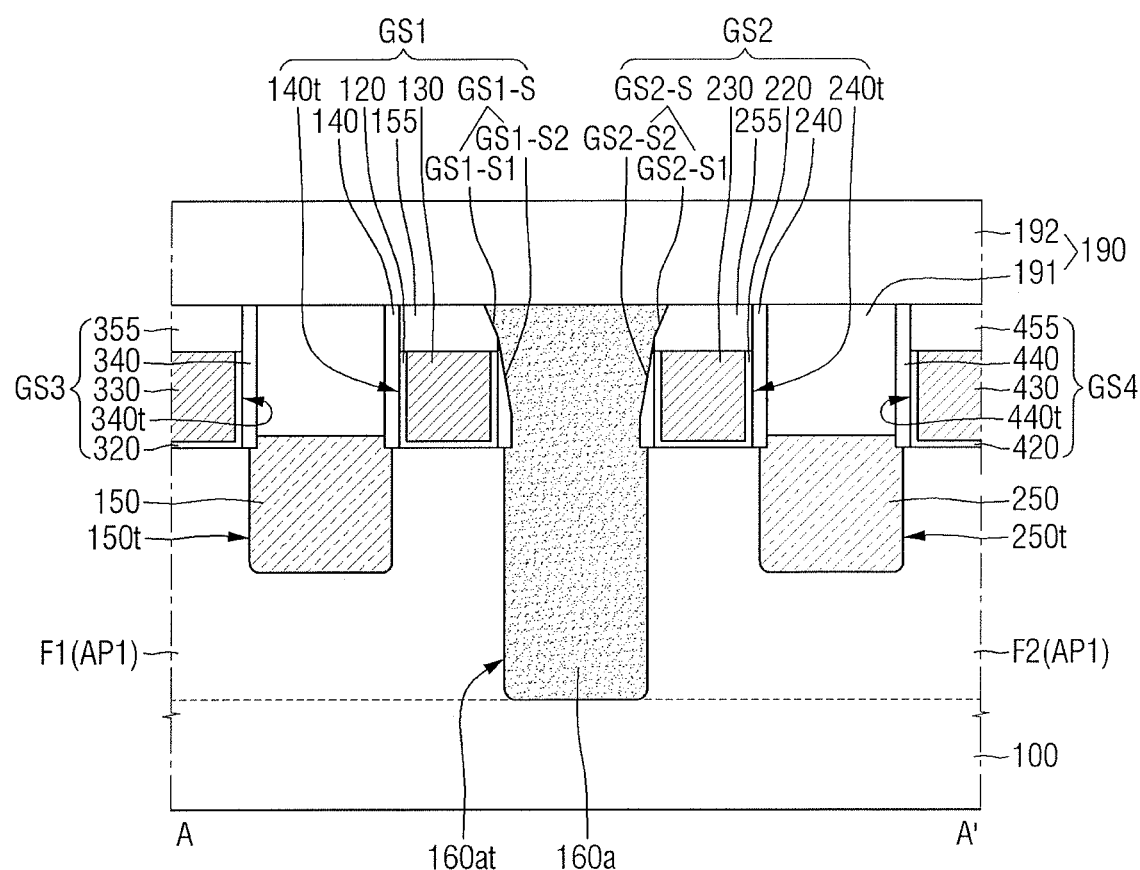
FIG. 8 illustrates a cross-sectional view of the semiconductor device according to some embodiments.

FIG. 8 illustrates a cross-sectional view of the semiconductor device according to some embodiments. For the sake of convenience of explanation, the repeated contents of parts described with reference to FIGS. 1 to 4 may be briefly described or omitted.

Referring to FIG. 8, in the semiconductor device according to some embodiments, the first inclined surface GS1-S and/or the second inclined surface GS2-S may include a plurality of acute angles, respectively.

For example, the first inclined surface GS1-S may include a first surface GS1-S1 having a first acute angle with respect to the upper surface of the first active pattern AP1, and a second surface GS1-S2 having a second acute angle different from the first acute angle. For example, the second inclined surface GS2-S may include a third surface GS2-S1 having a third acute angle with respect to the upper surface of the first active pattern AP1, and a fourth surface GS2-S2 having a fourth acute angle different from the third acute angle. Since the description of the second inclined surface GS2-S is similar to the description of the first inclined surface GS1-S, the first inclined surface GS1-S will be mainly described below.

In an implementation, the first surface GS1-S1 of the first inclined surface GS1-S may be defined by the first capping pattern 155, and the second surface GS1-S2 of the first inclined surface GS1-S may be defined by the first gate spacer 140.

This may be attributed to the characteristics of the etching process for forming the first separation trench 160at. For example, when the first gate spacer 140 and the first capping pattern 155 are exposed by the opening O of the mask pattern (180 of FIG. 30) described below, not only the first interlayer insulating film and the first active pattern AP1, but also the first gate spacer 140 and the first capping pattern 155 may also be etched. However, in the above etching process for forming the first separation trench 160at, the etching tolerance of the first capping pattern 155 and the etching tolerance of the first gate spacer 140 may be different from each other. As a result, the first acute angle of the first surface GS1-S1 and the second acute angle of the second surface GS1-S2 may be different from each other. For example, when the etching tolerance of the first capping pattern 155 is greater than the etching tolerance of the first gate spacer 140 in the above etching process, the first acute angle of the first surface GS1-S1 may be smaller than the second acute angle of the second surface GS1-S2.

In an implementation, as illustrated in FIG. 8, the first acute angle of the first surface GS1-S1 may be smaller than the second acute angle of the second surface GS1-S2. In an implementation, when the etching tolerance of the first capping pattern 155 is smaller than the etching tolerance of the first gate spacer 140 in the above etching process, the first acute angle of the first surface GS1-S1 may be greater than the second acute angle of the second surface GS1-S2.

Figure 9:
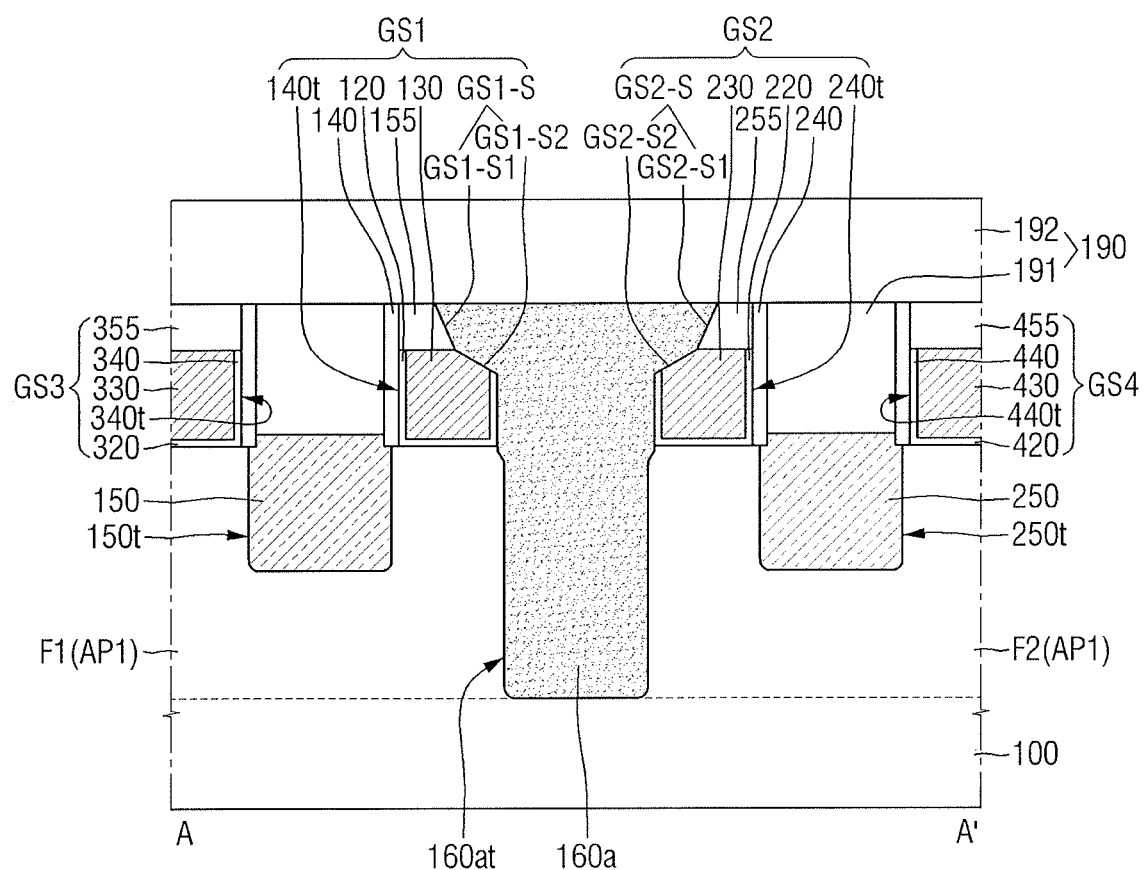
FIG. 9 illustrates a cross-sectional view of the semiconductor device according to some embodiments.

FIG. 9 illustrates a cross-sectional view of the semiconductor device according to some embodiments. For the sake of convenience of explanation, the repeated contents of parts described with reference to FIGS. 1 to 4 and 8 may be briefly explained or omitted.

Referring to FIG. 9, in the semiconductor device according to some embodiments, the first surface GS1-S1 of the first inclined surface GS1-S may be defined by the first capping pattern, and the second surface GS1-S2 of the first inclined surface GS1-S is defined by the first gate electrode 130. Since the description of the second inclined surface GS2-S is similar to the description of the first inclined surface GS1-S, the first inclined surface GS1-S may be mainly described.

In an implementation, the first acute angle of the first face GS1-S1 may be greater than the second acute angle of the second surface GS1-S2. For example, when the etching tolerance of the first capping pattern 155 is smaller than the etching tolerance of the first gate electrode 130 in the etching process for forming the first separation trench 160at, the first acute angle of the first surface GS1-S1 may be greater than the second acute angle of the second surface GS1-S2.

In an implementation, when the etching tolerance of the first capping pattern 155 is greater than the etching tolerance of the first gate electrode 130 in the above etching process, the first acute angle of the first surface GS1-S1 may be smaller than the second acute angle of the second surface GS1-S2.

Figure 10:
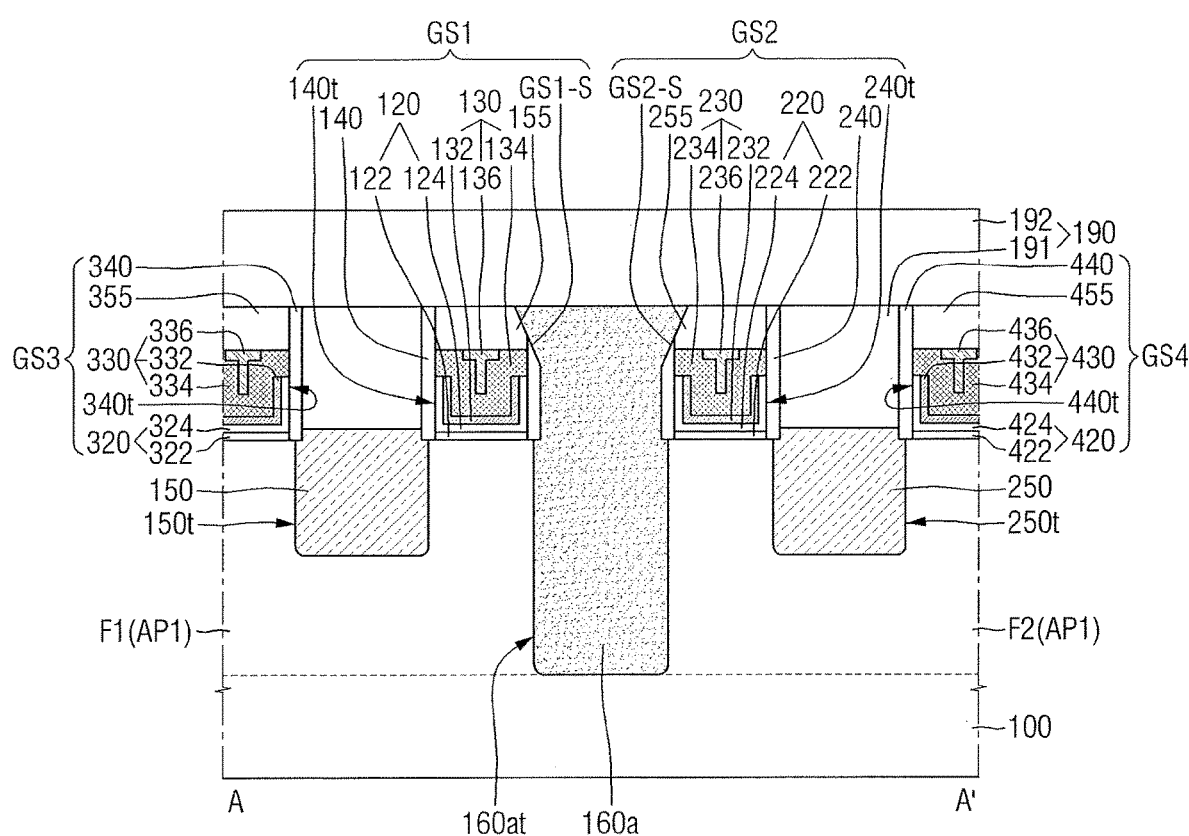
FIG. 10 illustrates a cross-sectional view of the semiconductor device according to some embodiments.

FIG. 10 illustrates a cross-sectional view of the semiconductor device according to some embodiments. For the sake of convenience of explanation, the repeated contents of parts described with reference to FIGS. 1 to 4 may be briefly described or omitted.

Referring to FIG. 10, in the semiconductor device according to some embodiments, each of the first to fourth gate electrodes 130, 230, 330 and 430 may include work function adjustment films, 132, 232, 332 and 432, insertion films 134, 234, 334 and 434, and filling films 136, 236, 336 and 436.

Each of the first to fourth work function adjustment films 132, 232, 332 and 432 may be formed on the first to fourth gate insulating films 120, 220, 320 and 420, respectively. In an implementation, each of the first to fourth gate insulating films 120, 220, 320 and 420 and each of the first to fourth work function adjustment films 132, 232, 332 and 432 may extend along only a part of the side walls of the respective first to fourth gate trenches 140t, 240t, 340t and 440t.

The first to fourth work function adjustment films 132, 232, 332 and 432 may include, e.g., a TiN film.

Each of the first to fourth insertion films 134, 234, 334, 434 may be formed on the first to fourth work function adjustment films 132, 232, 332 and 432, respectively. In an implementation, each of the first to fourth insertion films 134, 234, 334 and 434 may extend along other parts of the side walls of the respective first to fourth gate trenches 140t, 240t, 340t and 440t, and profiles of the respective first to fourth work function adjustment films 132, 232, 332 and 432.

Each of the first to fourth insertion films 134, 234, 334 and 434 may include, e.g., Ti, TiAl, TiAlN, TiAlC, TiAlCN, or combinations thereof.

Each of the first to fourth filling films 136, 236, 336 and 436 may be formed on each of the first to fourth insertion films 134, 234, 334 and 434, respectively. In an implementation, each of the first to fourth filling films 136, 236, 336 and 436 may fill the remaining regions of the respective first through fourth gate trenches 140t, 240t, 340t and 440t.

Each of the first to fourth filling films 136, 236, 336 and 436 may include, e.g., W, Al, Co, Cu, Ru, Ni, Pt, Ni-Pt, TiN, or combinations thereof In an implementation, each of the first to fourth gate insulating films 120, 220, 320 and 420 may include interfacial films 122, 222, 322 and 422 and dielectric films 124, 224, 324 and 424.

Each of the first to fourth interfacial films 122, 222, 322 and 422 may extend along the upper surface of the first active pattern AP1. Each of the first to fourth dielectric films 124, 224, 324 and 424 may be formed on each of the first to fourth interfacial films 122, 222, 322 and 422. In an implementation, each of the first to fourth dielectric films 124, 224, 324, 424 may extend along only some parts of the side walls of the respective first to fourth gate trenches 140t, 240t, 340t and 440t.

In an implementation, the uppermost surfaces of each of the first to fourth dielectric films 124, 224, 324 and 424 and the uppermost surfaces of each of the first to fourth work function adjustment films 132, 232, 332 and 432 may be substantially on the same plane.

Figure 11:
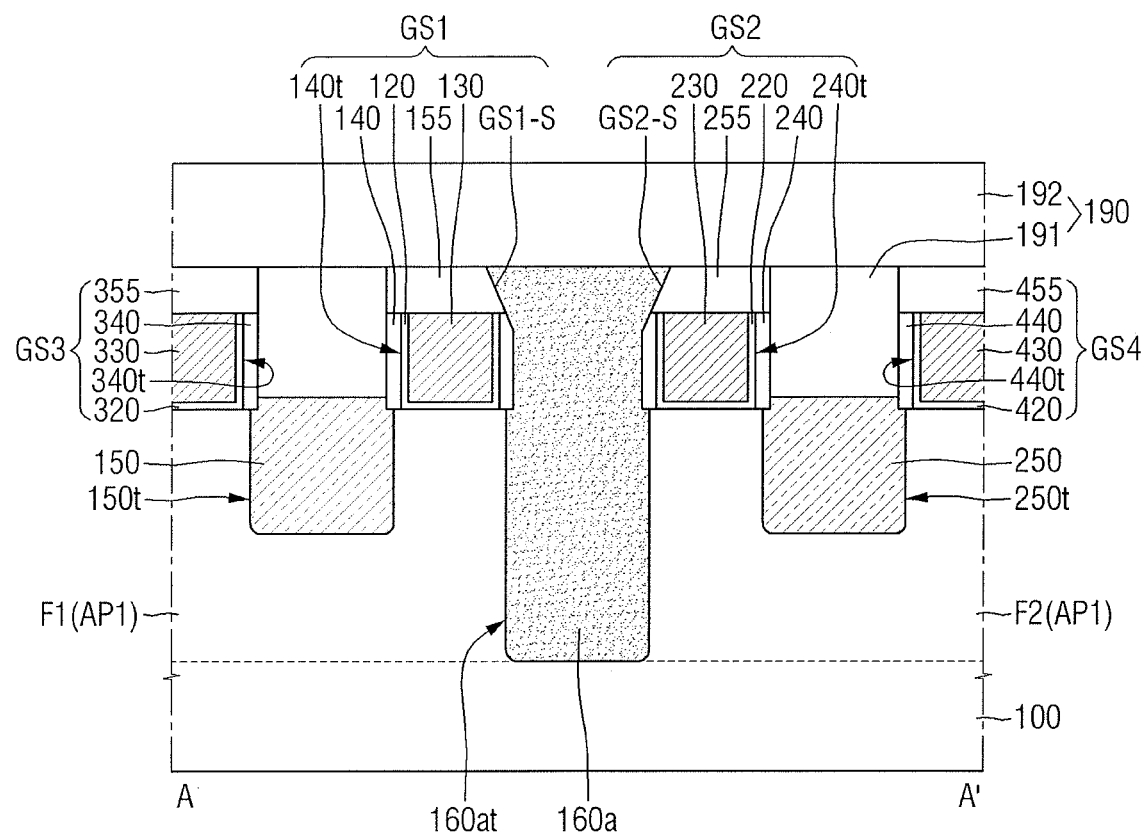
FIG. 11 illustrates a cross-sectional view of the semiconductor device according to some embodiments.

FIG. 11 illustrates a cross-sectional view of the semiconductor device according to some embodiments. For the sake of convenience of explanation, the repeated contents of parts described with reference to FIGS. 1 to 4 may be briefly described or omitted.

Referring to FIG. 11, in the semiconductor device according to some embodiments, each of the first to fourth capping patterns 155, 255, 355 and 455 may be formed on the upper surfaces of each of (e.g., respective ones of) the first to fourth gate spacers 140, 240, 340 and 440.

For example, each of the first to fourth capping patterns 155, 255, 355 and 455 may extend along the upper surfaces of each of the first to fourth gate spacers 140, 240, 340 and 440, the uppermost surfaces of each of the first to fourth gate insulating films 120, 220, 320 and 420, and the upper surfaces of each of the first to fourth gate electrodes 130, 230, 330 and 430.

In an implementation, the first capping pattern 155 may define at least a part of the first inclined surface GS1-S. For example, as illustrated, the first inclined surface GS1-S may be defined by the side wall of the first capping pattern 155 and the side wall of the first gate spacer 140.

In an implementation, the first inclined surface GS1-S may be defined only by the side wall of the first capping pattern 155.

In an implementation, the first inclined surface GS1-S may be defined by the first capping pattern 155 and the first gate electrode 130.

Figure 12:
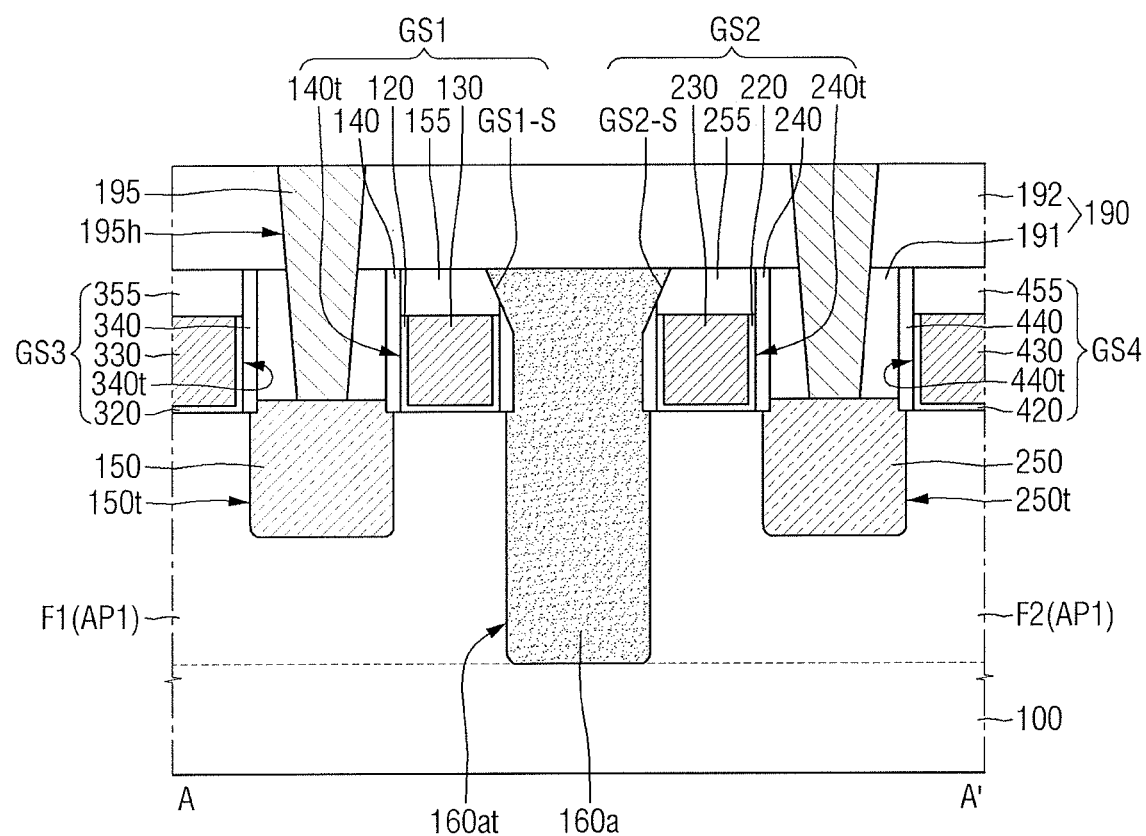
FIG. 12 illustrates a cross-sectional view of the semiconductor device according to some embodiments.

FIG. 12 illustrates a cross-sectional view of the semiconductor device according to some embodiments. For the sake of convenience of explanation, the repeated contents of parts described with reference to FIGS. 1 to 4 may be briefly described or omitted.

Referring to FIG. 12, the semiconductor device according to some embodiments may further include a contact 195 connected to the first and second source/drain regions 150 and 250.

The contact 195 may penetrate through the interlayer insulating film 190 and may be connected to the first and second source/drain regions 150 and 250. In an implementation, the contact 195 may not be in contact with the first to fourth gate structures GS1, GS2, GS3 and GS4. In an implementation, the contact 195 may also be in contact with the side walls of the first to fourth gate structures GS1, GS2, GS3 and GS4. The contact 195 may be formed, e.g., by a self-aligned contact (SAC) process.

In an implementation, the contact 195 may be made as a single structure. In an implementation, the contact 195 may include a plurality of structures arranged in the thickness direction of the substrate 100. In an implementation, a silicide film may be formed between the contact 195 and the first and second source/drain regions 150 and 250.

The contact 195 may include, e.g., tantalum (Ta), tantalum nitride (TaN), titanium (Ti), titanium nitride (TiN), tungsten nitride (WN), tungsten carbonitride (WCN), tungsten (W), cobalt (Co), ruthenium (Ru), molybdenum (Mo), nickel (Ni), aluminum (Al), copper (Cu), doped polysilicon, or combinations thereof.

Figure 13:
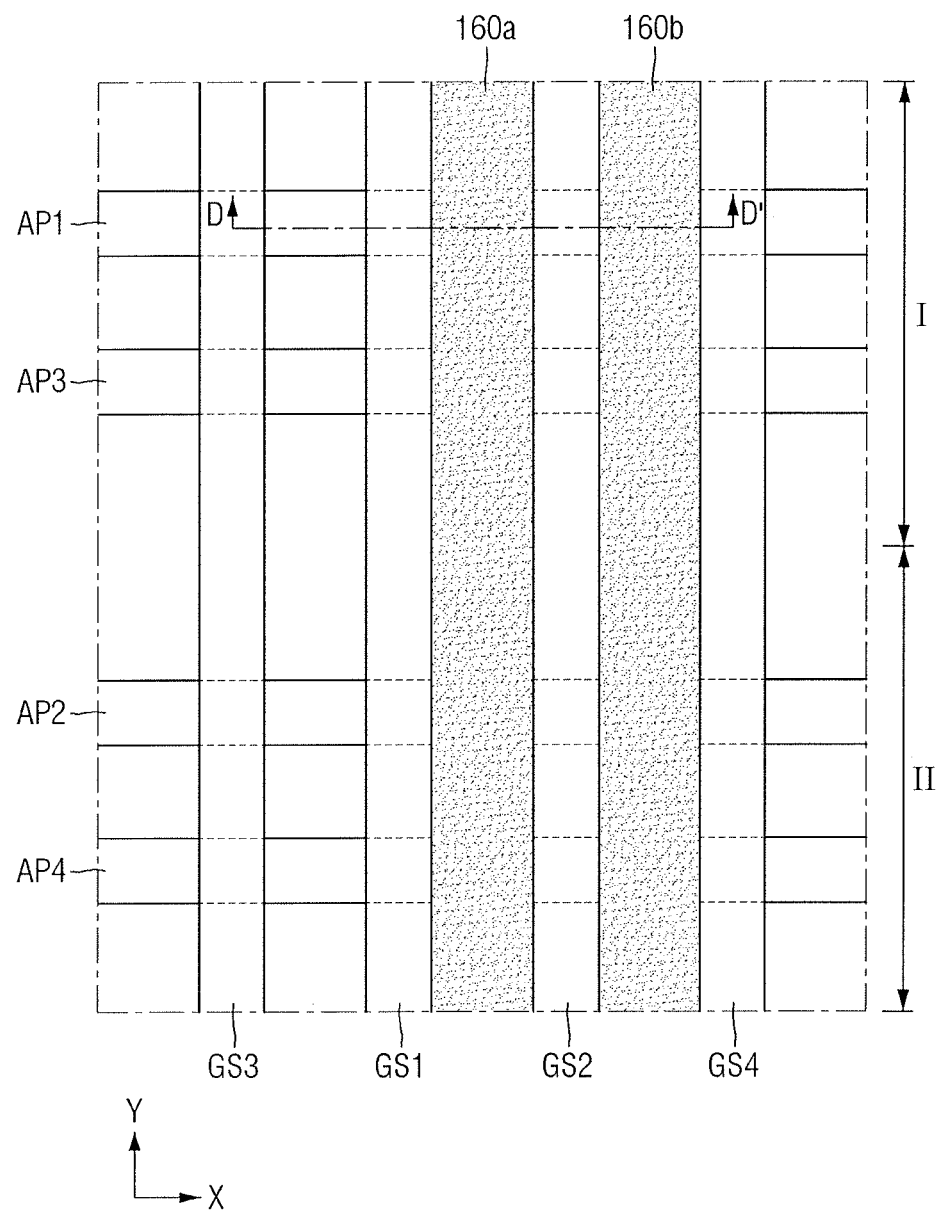
FIG. 13 illustrates a schematic layout diagram of the semiconductor device according to some embodiments.
Figure 14:
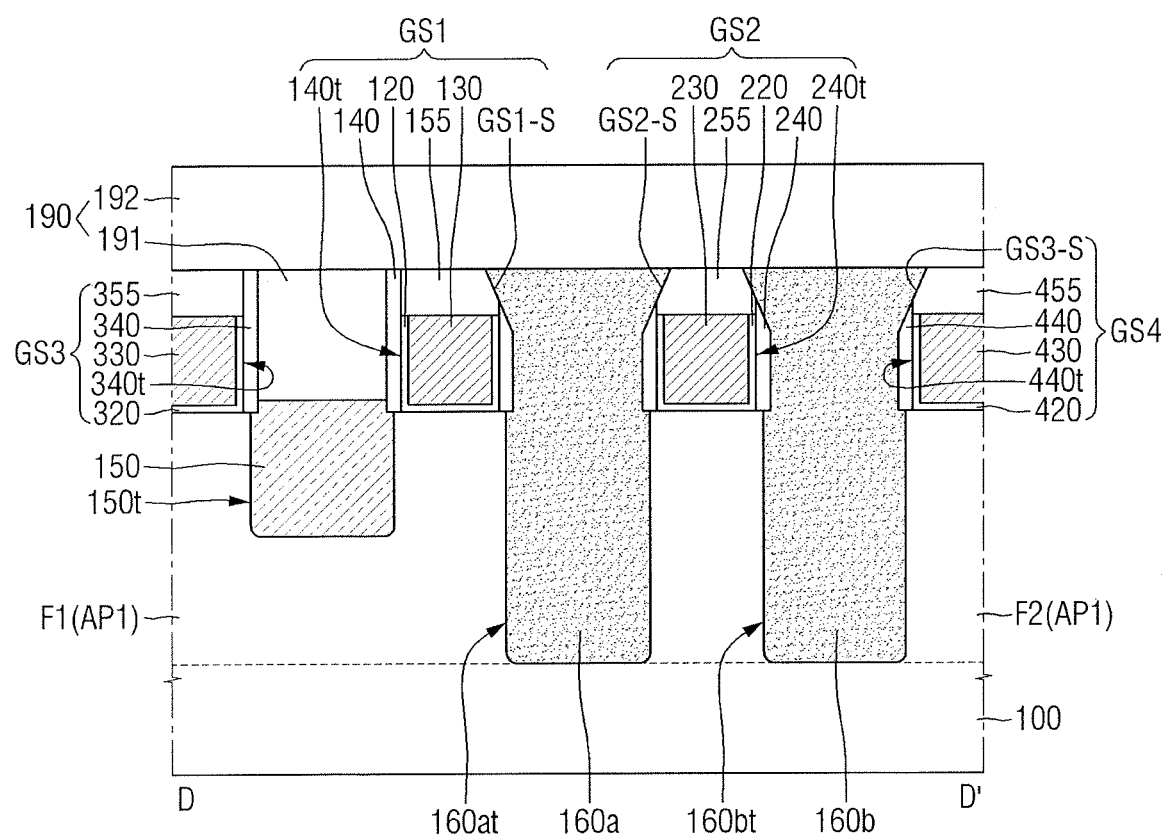
FIG. 14 illustrates a cross-sectional view taken along line D-D' of FIG. 13.

FIG. 13 illustrates a schematic layout diagram of the semiconductor device according to some embodiments. FIG. 14 illustrates a cross-sectional view taken along line D-D' of FIG. 13. For the sake of convenience of explanation, the repeated contents of parts described with reference to FIGS. 1 to 4 may be briefly described or omitted.

Referring to FIGS. 13 and 14, the semiconductor device according to some embodiments may further include a second device isolation film 160b.

The second device isolation film 160b may be between the second gate structure GS2 and the fourth gate structure GS4. The second device isolation film 160b may fill a second separation trench 160bt in the first active pattern AP1. The second separation trench 160bt may be formed in the first active pattern AP1 between the second gate structure GS2 and the fourth gate structure GS4. In addition, the second device isolation film 160b may extend in the second direction Y. For example, the second separation trench 160bt may extend in the second direction Y.

The upper surface of the second device isolation film 160b may be on substantially the same plane as the upper surface of the first interlayer insulating film 191. Further, the upper surface of the second device isolation film 160b may be on substantially the same plane as the upper surfaces of the first to fourth gate structures GS1, GS2, GS3, and GS4.

Like the first device isolation film 160a, the lowermost surface of the second device isolation film 160b may be lower than or equal to the uppermost surface of the field insulating film 110.

The side wall of the second gate structure GS2 and/or the side wall of the fourth gate structure GS4 facing the second device isolation film 160b may include an inclined surface having an acute angle with respect to the upper surface of the first active pattern AP1. For example, the side wall of the fourth gate structure GS4 facing the second device isolation film 160b may include a third inclined surface GS3-S.

In an implementation, the first device isolation film 160*a* and the second device isolation film 160*b* may be spaced apart from each other. For example, the first device isolation film 160*a* and the second device isolation film 160*b* may be spaced apart from each other by the second gate structure GS2 (e.g., therebetween).

Figure 15:
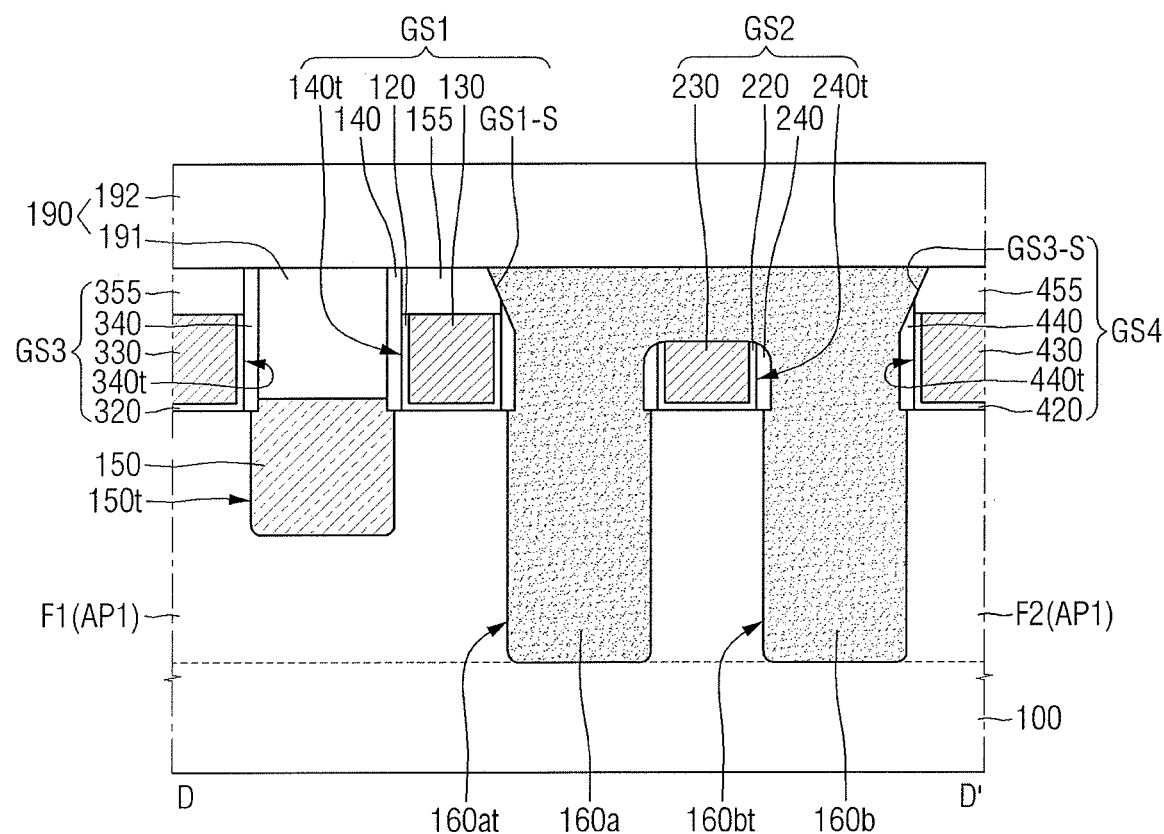
FIG. 15 illustrates a cross-sectional view of the semiconductor device according to some embodiments.

FIG. 15 illustrates a cross-sectional view of the semiconductor device according to some embodiments. For the sake of convenience of explanation, repeated contents of parts described with reference to FIGS. 1 to 4, 13 and 14 may be briefly described or omitted.

Referring to FIG. 15, in the semiconductor device according to some embodiments, the first device isolation film 160*a* and the second device isolation film 160*b* may be connected to each other.

For example, the upper part of the first device isolation film 160*a* and the upper part of the second device isolation film 160*b* may be connected to each other on the upper surface of the second gate structure GS2. This may be attributed to an etching process for forming the first and second separation trenches 160*at* and 160*bt*. For example, when the upper surface of the second gate structure GS2 is completely exposed by the opening O of the mask pattern (180 of FIG. 30) described below, not only the first interlayer insulating film 191 and the active pattern AP1, but also the upper part of the second gate structure GS2 may be etched.

In an implementation, the second capping pattern (255 in FIG. 2) of the second gate structure GS2 may be completely removed. In an implementation, the second capping pattern (255 of FIG. 2) of the second gate structure GS2 may remain.

Figure 16:
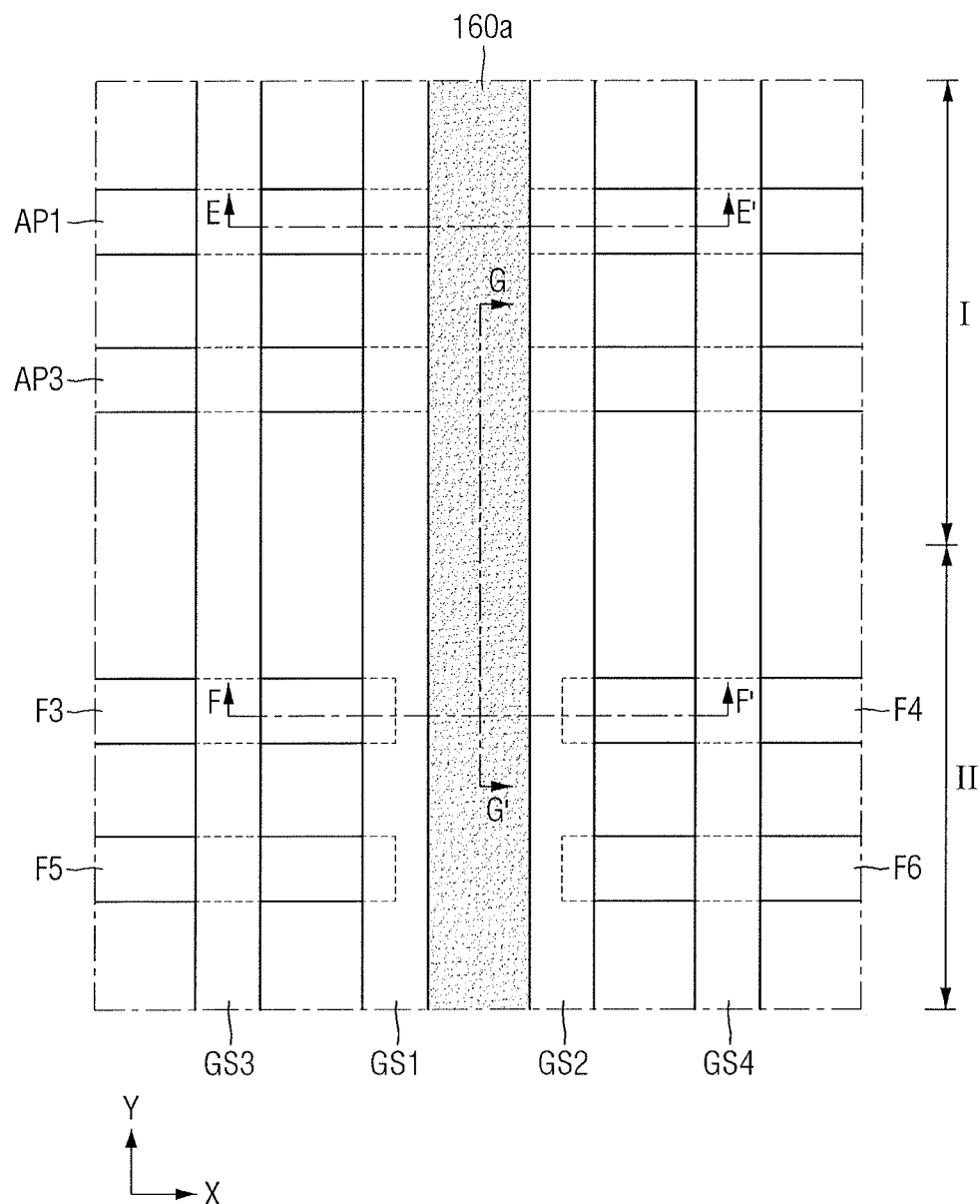
FIG. 16 illustrates a schematic layout diagram of the semiconductor device according to some embodiments.
Figure 17:
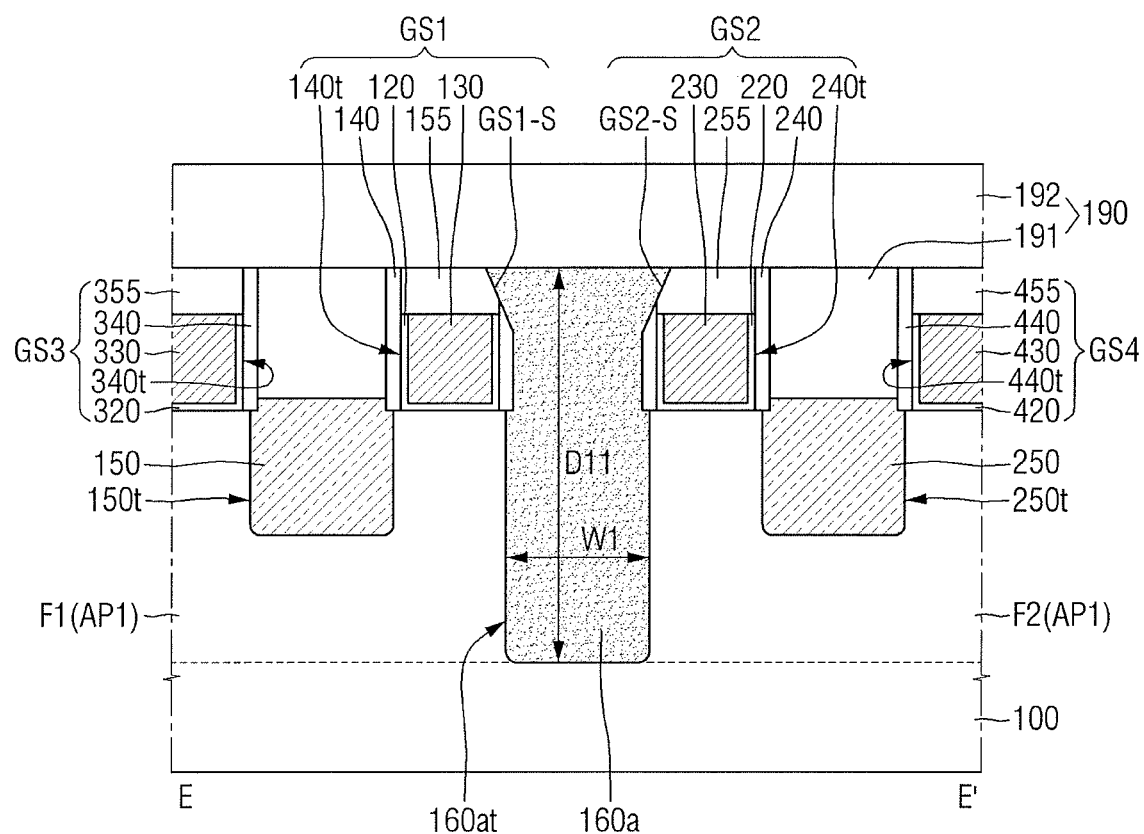
FIG. 17 illustrates a cross-sectional view taken along line E-E' of FIG. 16.
Figure 18:
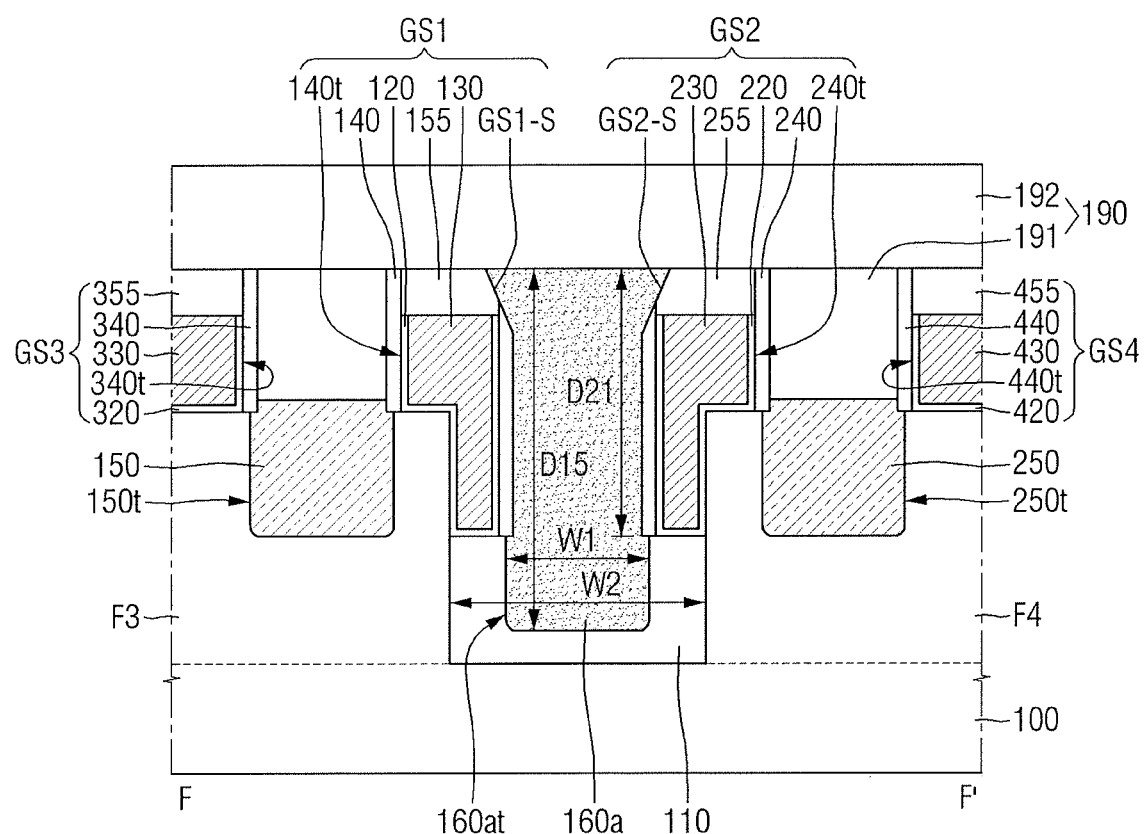
FIG. 18 illustrates a cross-sectional view taken along line F-F' of FIG. 16.
Figure 19:
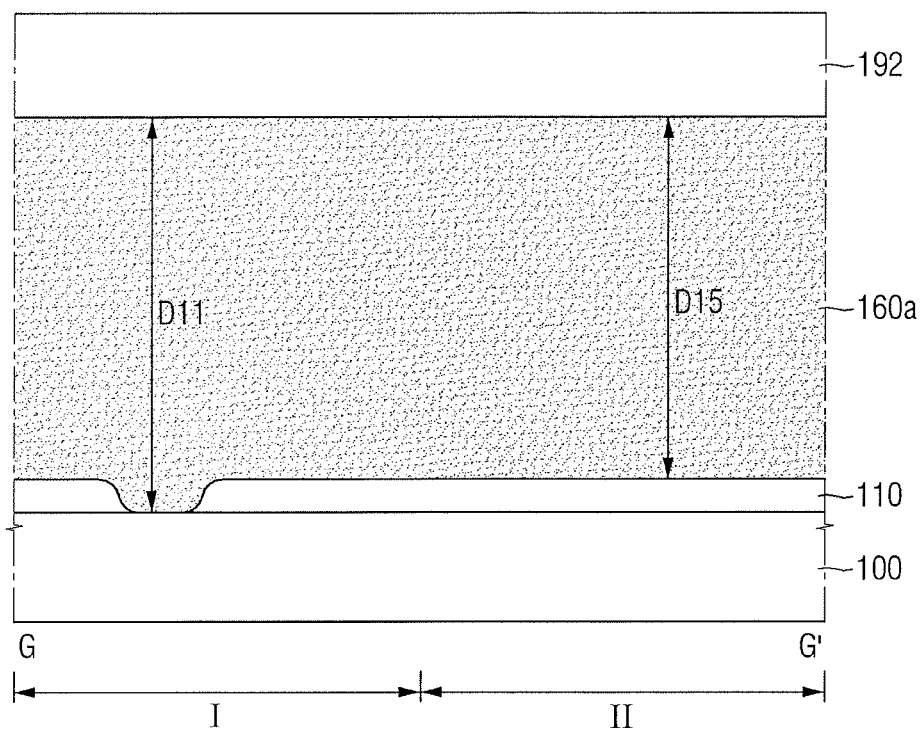
FIG. 19 illustrates a cross-sectional view taken along line G-G' of FIG. 16.

FIG. 16 illustrates a schematic layout diagram of the semiconductor device according to some embodiments. FIG. 17 illustrates a cross-sectional view taken along line E-E' of FIG. 16. FIG. 18 illustrates a cross-sectional view taken along line F-F' of FIG. 16. FIG. 19 illustrates a cross-sectional view taken along line G-G' of FIG. 16. For the sake of convenience of explanation, the repeated contents of parts described with reference to FIGS. 1 to 4 may be briefly described or omitted.

Referring to FIGS. 16 to 19, the semiconductor device according to some embodiments may include third to sixth fin type patterns F3, F4, F5 and F6.

The third to sixth fin type patterns F3, F4, F5 and F6 may be on the second region II of the substrate 100. The third fin type pattern F3 and the fifth fin type pattern F5 may be arranged along (e.g., spaced apart in) the second direction Y, and the fourth fin type pattern F4 and the sixth fin type The pattern F6 may be arranged along the second direction Y.

The third fin type pattern F3 and the fourth fin type pattern F4 may be arranged along (e.g., spaced apart in) the first direction X and may extend in the first direction X, respectively. As illustrated in FIG. 18, the third fin type pattern F3 and the fourth fin type pattern F4 may be separated from each other by the field insulating film 110. For example, the second active pattern AP2 of FIG. 1 may be separated by the field insulating film 110 to form the third fin type pattern F3 and the fourth fin type pattern F4.

The fifth fin type pattern F5 and the sixth fin type pattern F6 may be arranged along the first direction X and may extend in the first direction X, respectively. Like the third fin type pattern F3 and the fourth fin type pattern F4, the fifth fin type pattern F5 and the sixth fin type pattern F6 may be separated by the field insulating film 110. For example, the fourth active pattern AP4 of FIG. 1 may be separated by the field insulating film 110 to form the fifth fin type pattern F5 and the sixth fin type pattern F6.

The first device isolation film 160*a* may extend in the second direction Y over the first region I and the second region II. The first device isolation film 160*a* may be between the third fin type pattern F3 and the fourth fin type pattern F4 and between the fifth fin type pattern F5 and the sixth fin type pattern F6. As a result, the third fin type pattern F3 and the fourth fin type pattern F4 may be separated by the field insulating film 110 and the first device isolation film 160*a*. Further, the fifth fin type pattern F5 and the sixth fin type pattern F6 may be separated by the field insulating film 110 and the first device isolation film 160*a*.

The lower part of the first device isolation film 160*a* between the third fin type pattern F3 and the fourth fin type pattern F4 may be in the field insulating film 110. For example, as illustrated in FIG. 18, the first separation trench 160*at* between the third fin type pattern F3 and the fourth fin type pattern F4 may be in the field insulating film 110 between the third fin type pattern F3 and the fourth fin type pattern F4. The lower part of the first device isolation film 160*a* between the third fin type pattern F3 and the fourth fin type pattern F4 may fill the first separation trench 160*at* between the third fin type pattern F3 and the fourth fin type pattern F4. As a result, the field insulating film 110 between the third fin type pattern F3 and the fourth fin type pattern F4 may surround the lower part of the first device isolation film 160*a*.

In an implementation, the lower surface of the first device isolation film 160*a* in the first active pattern AP1 may be lower than the lower surface of the first device isolation film 160*a* between the third fin type pattern F3 and the fourth fin type pattern F4. For example, a distance (D11 of FIGS. 17 and 19) from the lower surface of the second interlayer insulating film 192 to the lower surface of the first device isolation film 160*a* in the first active pattern AP1 may be greater than a distance (D15 of FIGS. 18 and 19) from the lower surface of the second interlayer insulating film 192 to the lower surface of the first device isolation film 160*a* between the third fin type pattern F3 and the fourth fin type pattern F4.

In an implementation, the width of the first device isolation film 160*a* may be smaller than the width of the field insulating film 110 between the third fin type pattern F3 and the fourth fin type pattern F4. Here, the width refers to a width in the first direction X. For example, the width (W1 of FIG. 18) of the first device isolation film 160*a* may be smaller than the width (W2 of FIG. 18) of the field insulating film 110 between the third fin type pattern F3 and the fourth fin type pattern F4.

In an implementation, the field insulating film 110 between the third fin type pattern F3 and the fourth fin type pattern F4 may overlap at least a part of the first gate structure GS1 and at least a part of the second gate structure GS2. For example, as illustrated in FIG. 18, the first gate structure GS1 may extend along the upper surface of the third fin type pattern F3 and the upper surface of the field insulating film 110, and the second gate structure GS2 may extend along the upper surface of the fourth fin type pattern F4 and the upper surface of the field insulating film 110.

In an implementation, the uppermost surface of the field insulating film 110 between the third fin type pattern F3 and the fourth fin type pattern F4 may be lower than the upper surface of the third fin type pattern F3 and the upper surface of the fourth fin type pattern F4. For example, a distance (D21 of FIG. 18) from the lower surface of the second interlayer insulating film 192 to the uppermost surface of the field insulating film 110 between the third fin type pattern F3 and the fourth fin type pattern F4 may be smaller than the distance from the lower surface of the second interlayer insulating film 192 to the upper surface of the third fin type pattern F3 and the upper surface of the fourth fin type pattern F4.

In an implementation, the field insulating film 110 may include silicon oxide, and the first device isolation film 160a may include silicon nitride. In the NMOS region, the field insulating film including silicon oxide may help improve the performance of the semiconductor element by applying stress to the channel region. In the semiconductor device according to some embodiments, by forming the first device isolation film 160a on the field insulating film 110 containing silicon oxide, stress applied to the field insulating film 110 can be maintained.

Figure 20:
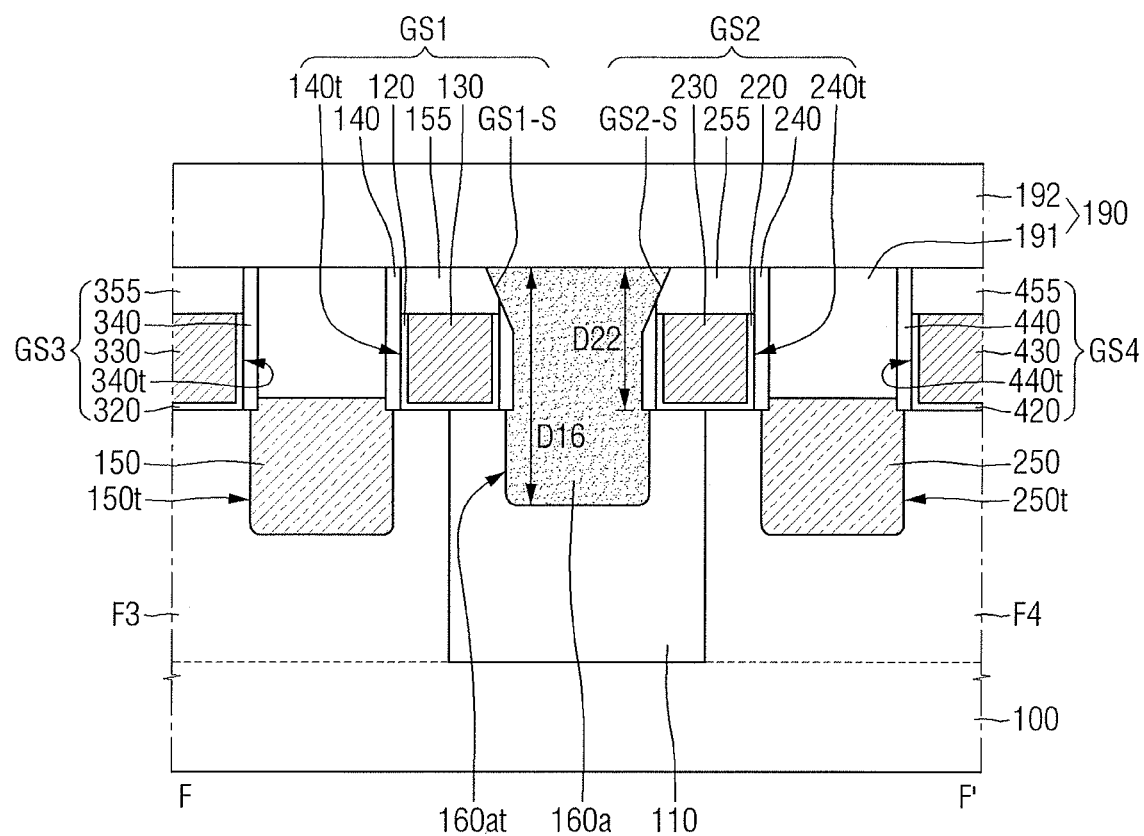
FIG. 20 illustrates a cross-sectional view of the semiconductor device according to some embodiments.

FIG. 20 illustrates a cross-sectional view of the semiconductor device according to some embodiments. For the sake of convenience of explanation, repeated contents of parts described with reference to FIGS. 1 to 4 and 16 to 19 may be briefly explained or omitted.

Referring to FIG. 20, in the semiconductor device according to some embodiments, the upper surface of the field insulating film 110 between the third fin type pattern F3 and the fourth fin type pattern F4 may be on substantially the same plane as the upper surface of the third fin type pattern F3 and the upper surface of the fourth fin type pattern F4.

For example, the distance (D22 of FIG. 20) from the lower surface of the second interlayer insulating film 192 to the uppermost surface of the field insulating film 110 between the third fin type pattern F3 and the fourth fin type pattern F4 may be smaller than the distance from the lower surface of the second interlayer insulating film 192 to the upper surface of the third fin type pattern F3 and the upper surface of the fourth fin type pattern F4.

In an implementation, the lower surface of the first device isolation film 160a between the third fin type pattern F3 and the fourth fin type pattern F4 may be smaller than the uppermost surface of the field insulating film 110 between the third fin type pattern F3 and the fourth fin type pattern F4. For example, a distance (D16 of FIG. 20) from the lower surface of the second interlayer insulating film 192 to the lower surface of the first device isolation film 160a between the third fin type pattern F3 and the fourth fin type pattern F4 may be smaller than a distance (D22 of FIG. 20) from the lower surface of the second interlayer insulating film 192 to the uppermost surface of the field insulating film 110 between the third fin type pattern F3 and the fourth fin type pattern F4.

Figure 21:
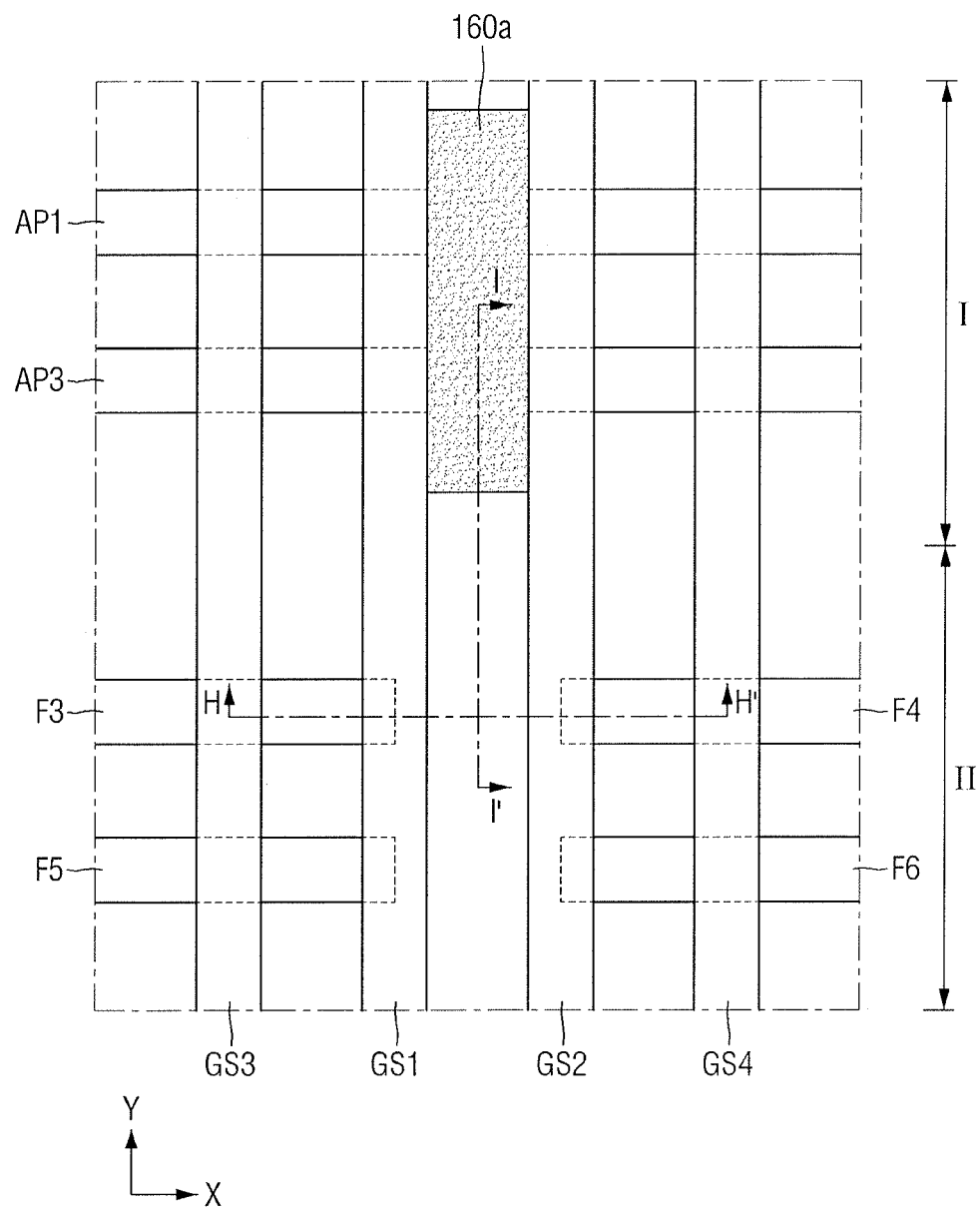
FIG. 21 illustrates a schematic layout diagram of the semiconductor device according to some embodiments.
Figure 22:
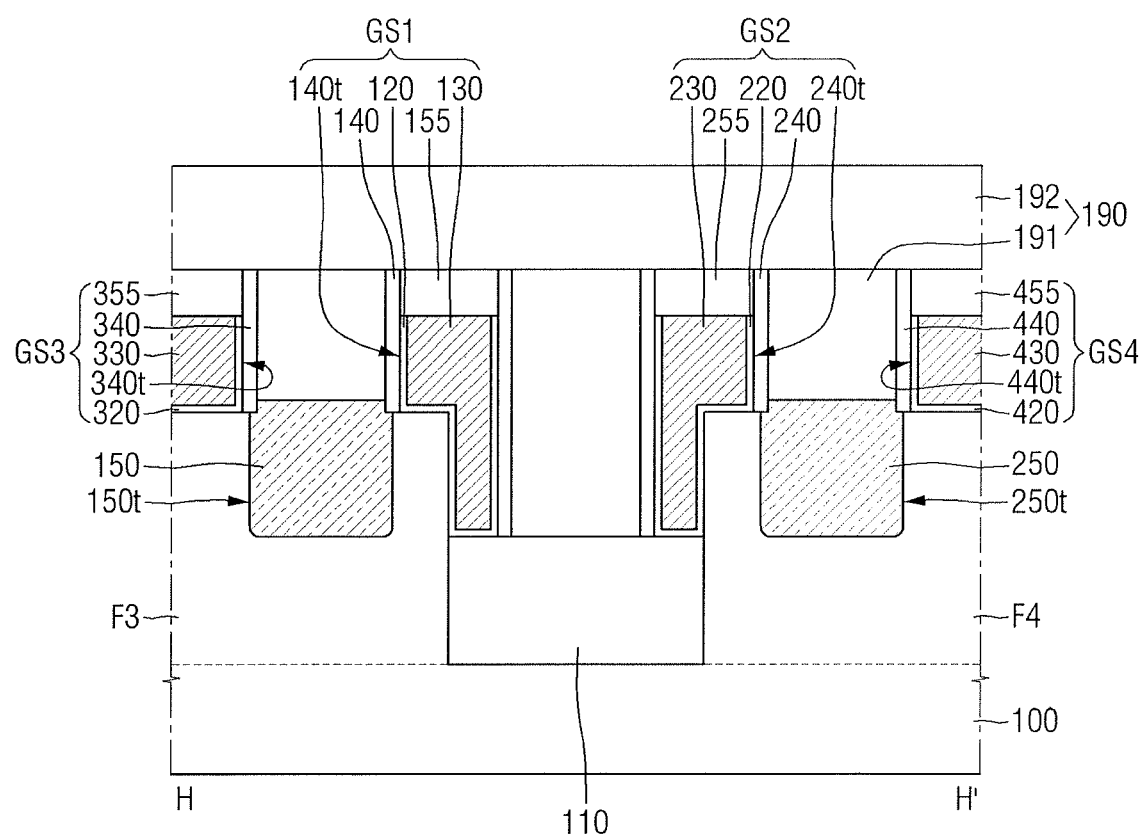
FIG. 22 illustrates a cross-sectional view taken along line H-H' of FIG. 21.
Figure 23:
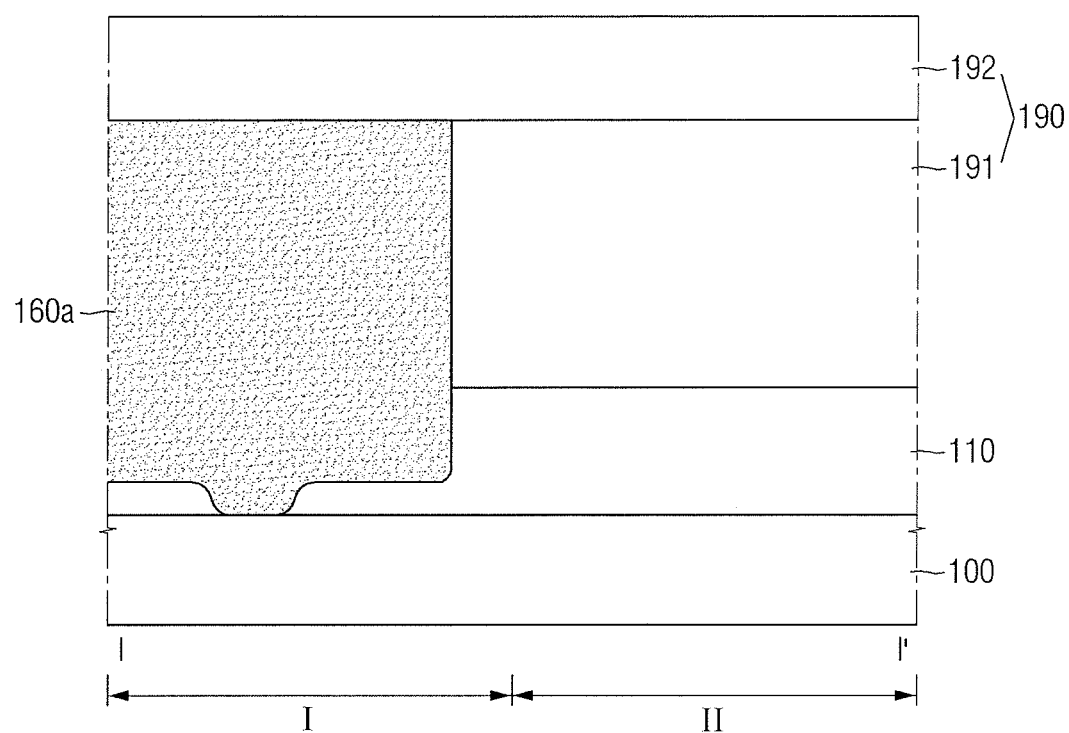
FIG. 23 illustrates a cross-sectional view taken along line I-I of FIG. 21.

FIG. 21 illustrates a schematic layout diagram of the semiconductor device according to some embodiments. FIG. 22 illustrates a cross-sectional view taken along line H-H' of FIG. 21. FIG. 23 illustrates a cross-sectional view taken along line I-I of FIG. 21. For the sake of convenience of explanation, repeated contents of parts described with reference to FIGS. 1 to 4 and 16 to 19 may be briefly explained or omitted.

Referring to FIGS. 21 to 23, in the semiconductor device according to some embodiments, the first device isolation film 160a may be formed on the first region I of the substrate 100, and may not be formed on the second region II of the substrate 100.

The first device isolation film 160a may extend in the second direction Y on the first region I of the substrate 100. As a result, the first device isolation film 160a may intersect the first active pattern AP1 and the third active pattern AP3.

The first device isolation film 160a may not be formed between the third fin type pattern F3 and the fourth fin type pattern F4. Also, the first device isolation film 160a may not be formed between the fifth fin type pattern F5 and the sixth fin type pattern F6.

The first interlayer insulating film 191 may be between the first gate structure GS1 and the second gate structure GS2 on the second region II of the substrate 100. For example, as illustrated in FIGS. 22 and 23, the first interlayer insulating film 191 may be on the upper surface of the field insulating film 110 between the third fin type pattern F3 and the fourth fin type pattern F4. As a result, the third fin type pattern F3 and the fourth fin type pattern F4 may be separated by the field insulating film 110 and the first interlayer insulating film 191. Similarly, the fifth fin type pattern F5 and the sixth fin type pattern F6 may be separated by the field insulating film 110 and the first interlayer insulating film 191.

Figure 24:
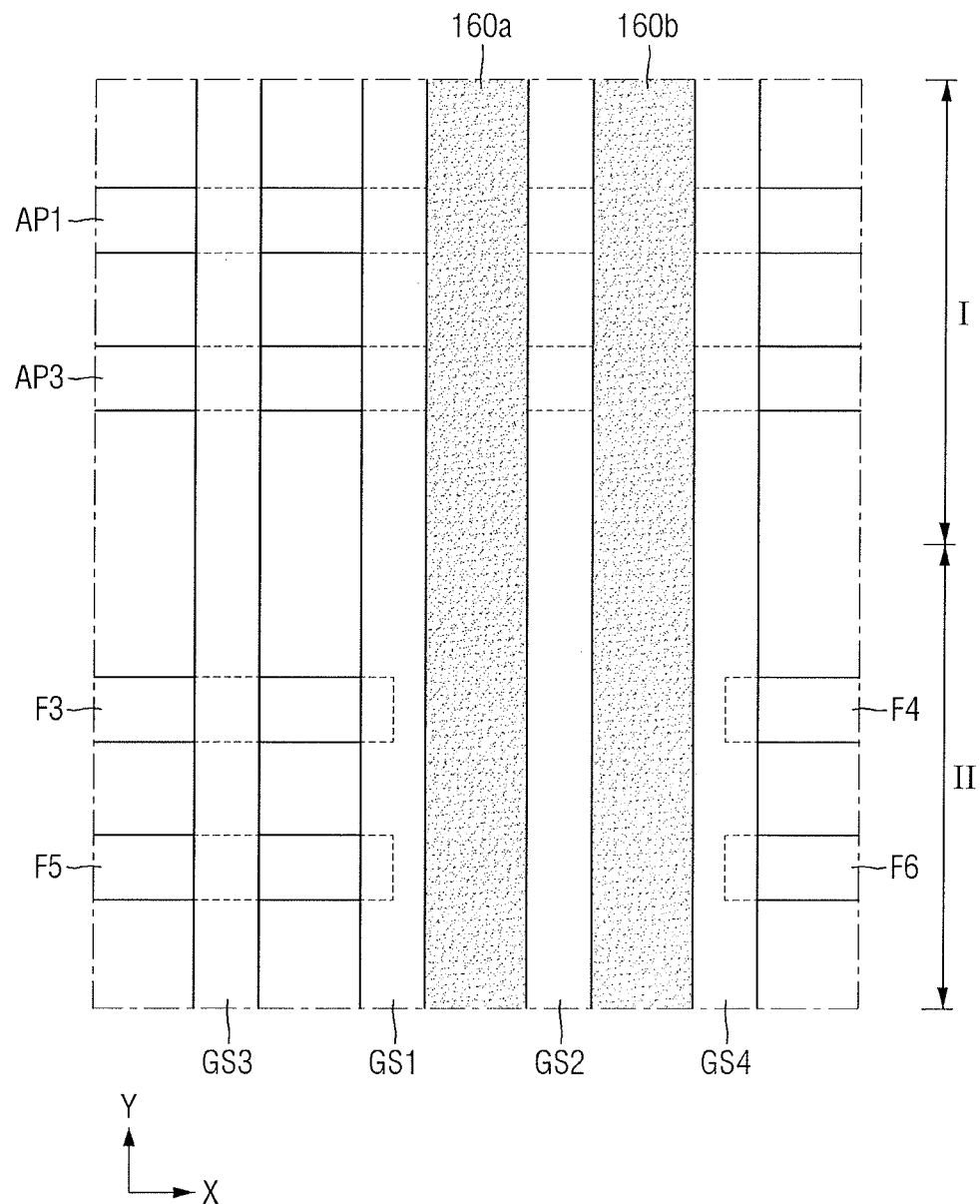
FIG. 24 illustrates a schematic layout diagram of the semiconductor device according to some embodiments.

FIG. 24 illustrates a schematic layout diagram of the semiconductor device according to some embodiments. For the sake of convenience of explanation, the repeated contents of parts described with reference to FIGS. 1 to 4 and FIGS. 13 to 19 may be briefly explained or omitted.

Referring to FIG. 24, in the semiconductor device according to some embodiments, the first device isolation film 160a and the second device isolation film 160b may be between the third fin type pattern F3 and the fourth fin type pattern F4, and between the fifth fin type pattern F5 and the sixth fin type pattern F6.

As a result, the third fin type pattern F3 and the fourth fin type pattern F4 may be separated from each other by the field insulating film 110, the first device isolation film 160a and the second device isolation film 160b. Further, the fifth fin type pattern F5 and the sixth fin type pattern F6 may be separated by the field insulating film 110, the first device isolation film 160a and the second device isolation film 160b.

Figure 25:
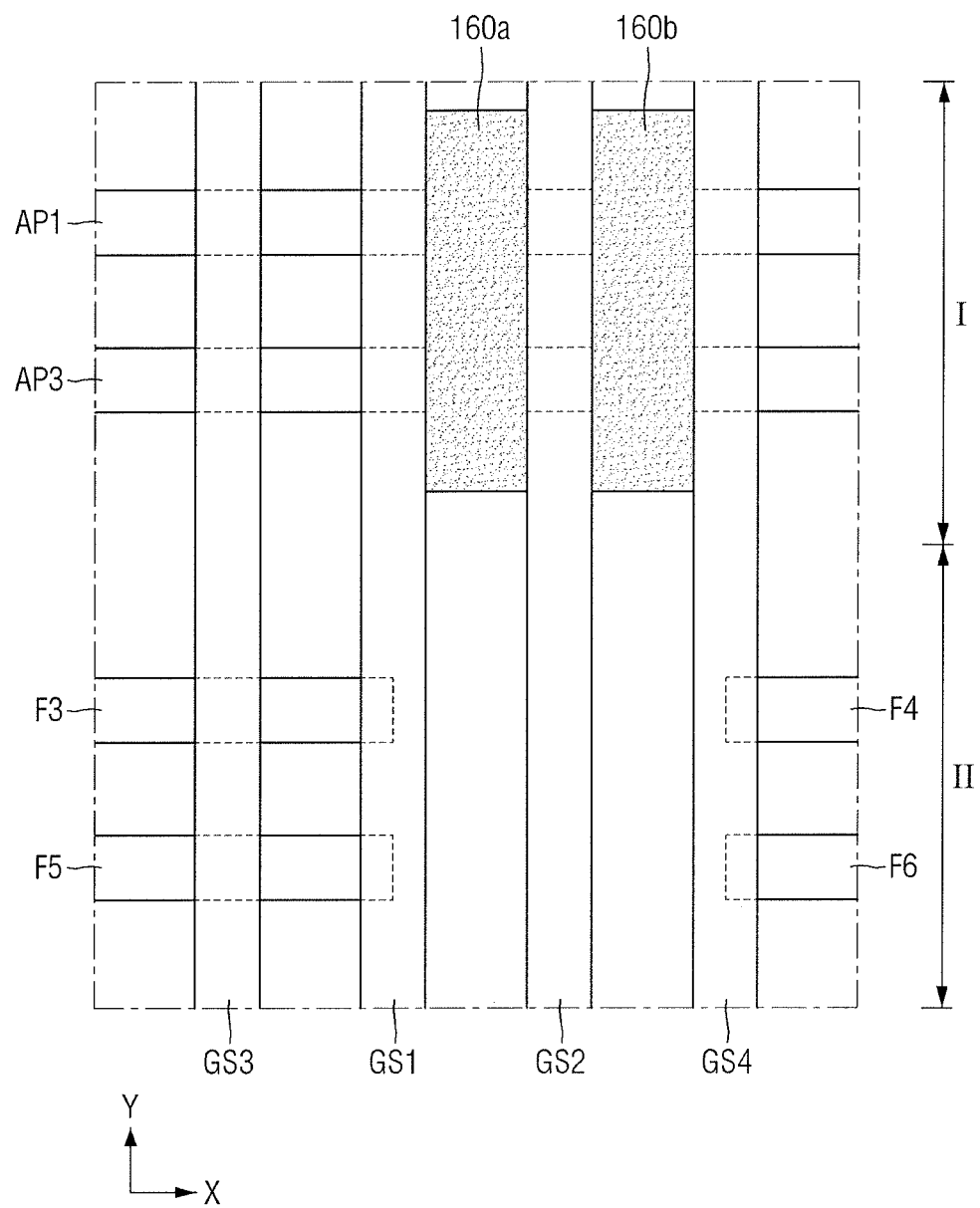
FIG. 25 illustrates a schematic layout diagram of the semiconductor device according to some embodiments.

FIG. 25 illustrates a schematic layout diagram for explaining the semiconductor device according to some embodiments. For the sake of convenience of explanation, the repeated contents of parts described with reference to FIGS. 1 to 4 and 13 to 24 may be briefly described or omitted.

Referring to FIG. 25, in the semiconductor device according to some embodiments, the first device isolation film 160a and the second device isolation film 160b may be on the first region I of the substrate 100, and may not be on the second region II of the substrate 100.

The first device isolation film 160a and the second device isolation film 160b may extend in the second direction Y on the first region I of the substrate 100. Thus, the first device isolation film 160a and the second device isolation film 160b may intersect the first active pattern AP1 and the third active pattern AP3.

The first device isolation film 160a and the second device isolation film 160b may not be between the third fin type pattern F3 and the fourth fin type pattern F4. In addition, the first device isolation film 160a and the second device isolation film 160b may not be between the fifth fin type pattern F5 and the sixth fin type pattern F6.

The first interlayer insulating film 191 may be between the first gate structure GS1 and the second gate structure GS2 and between the second gate structure GS2 and the fourth gate structure GS4, on the second region II of the substrate 100. As a result, the third fin type pattern F3 and the fourth fin type pattern F4 may be separated by the field insulating film 110 and the first interlayer insulating film 191. Similarly, the fifth fin type pattern F5 and the sixth fin type pattern F6 may be separated by the field insulating film 110 and the first interlayer insulating film 191.

Hereinafter, a method for fabricating a semiconductor device according to some embodiments will be described with reference to FIGS. 1 to 4, 16 to 19, and 26 to 31.

FIGS. 26 to 31 illustrate stages in a method for fabricating the semiconductor device according to some embodiments. For the sake of convenience of explanation, repeated contents of parts described with reference to FIGS. 1 to 25 may be briefly described or omitted.

Figure 26:
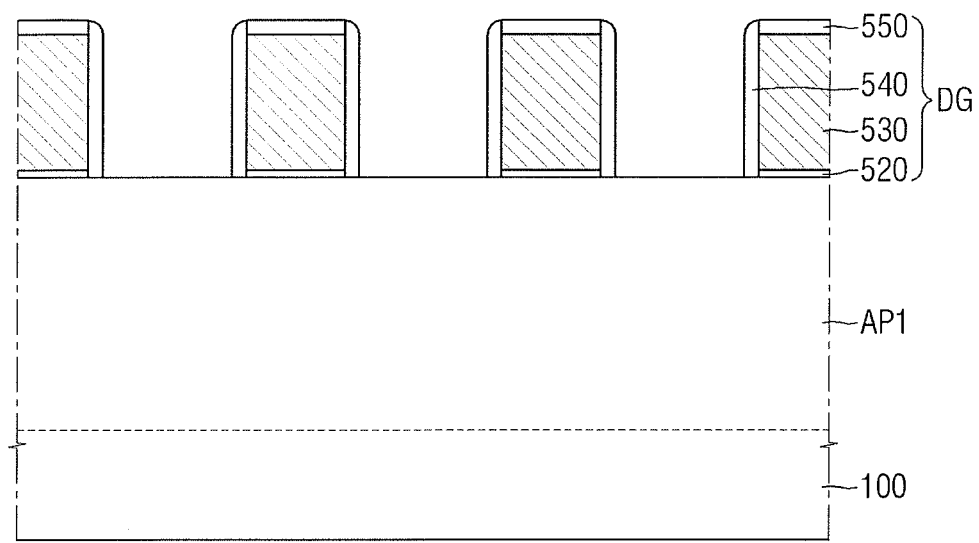
FIGS. 26 to 31 illustrate stages in a method for fabricating the semiconductor device according to some embodiments.

Referring to FIG. 26, the first active pattern AP1 and a plurality of dummy gate structures DG may be formed on the substrate 100.

The first active pattern AP1 may be formed to protrude from the substrate 100. For example, the first active pattern AP1 may extend in the first direction (X of FIG. 1). The first active pattern AP1 may be a part of the substrate 100 and may include an epitaxial layer grown from the substrate 100. Subsequently, the plurality of dummy gate structures DG intersecting the first active pattern AP1 may be formed on the first active pattern AP1. For example, each dummy gate structure DG may extend in the second direction (Y of FIG. 1). Each dummy gate structure DG may include a dummy gate insulating film 520, a dummy gate electrode 530, a first mask pattern 550 and a preliminary gate spacer 540.

Figure 27:
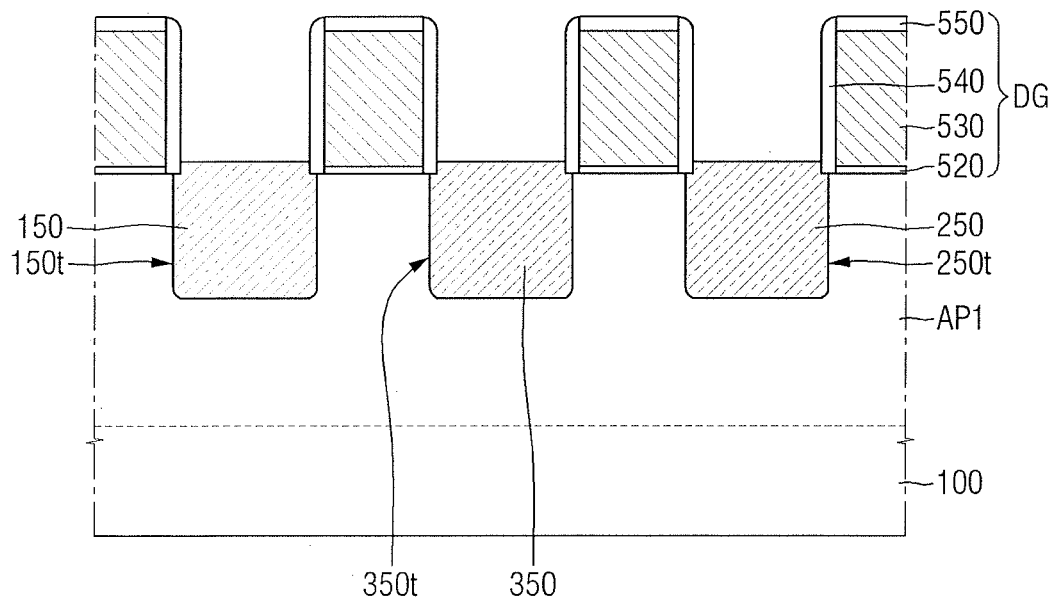

Referring to FIG. 27, first to third source/drain regions 150, 250 and 350 may be formed in the first active pattern AP 1.

For example, a part of the first active pattern AP1 may be etched, using each dummy gate structure DG as an etching mask. As a result, first to third source/drain trenches 150*t*, 250*t* and 350*t* may be formed in the first active pattern AP1. Subsequently, first to third source/drain regions 150, 250 and 350 for filling each of the first to third source/drain trenches 150*t*, 250*t* and 350*t* may be formed, respectively. The first to third source/drain regions 150, 250 and 350 may be formed by, e.g., an epitaxial growth process.

Figure 28:
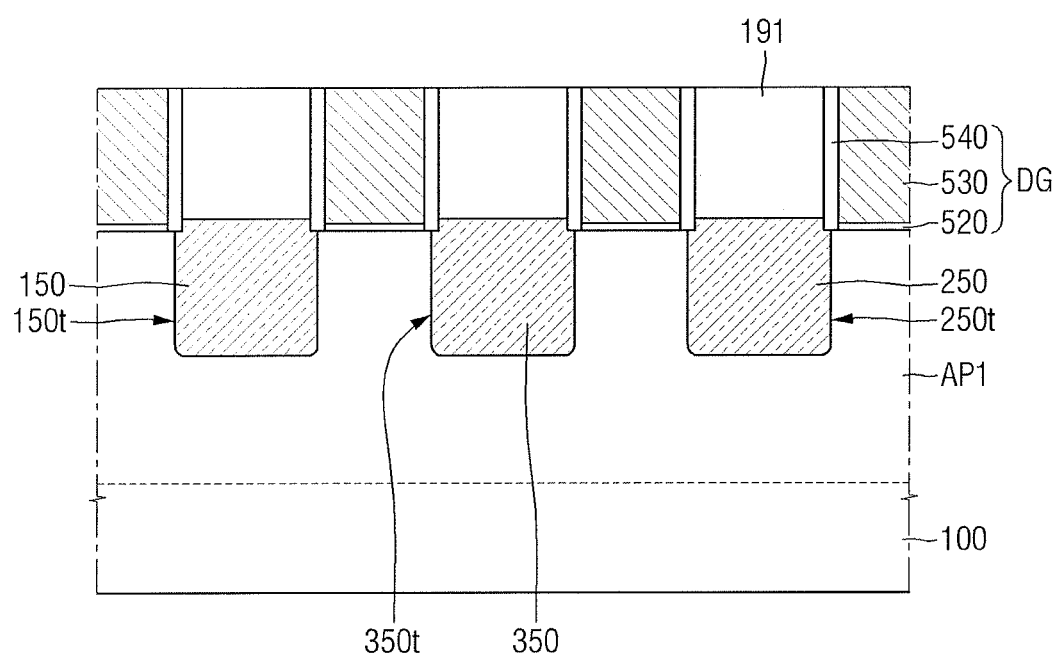

Referring to FIG. 28, a first interlayer insulating film 191 may be formed on the first to third source/drain regions 150, 250 and 350.

For example, an insulating film may be formed on the resultant product of FIG. 27. Subsequently, a planarization process may be performed. The planarization process may be performed, e.g., until the upper surface of the dummy gate electrode 530 is exposed. As a result, a first interlayer insulating film 191 which covers the side walls of the respective dummy gate structures DG may be formed on the first to third source/drain regions 150, 250, and 350.

Figure 29:
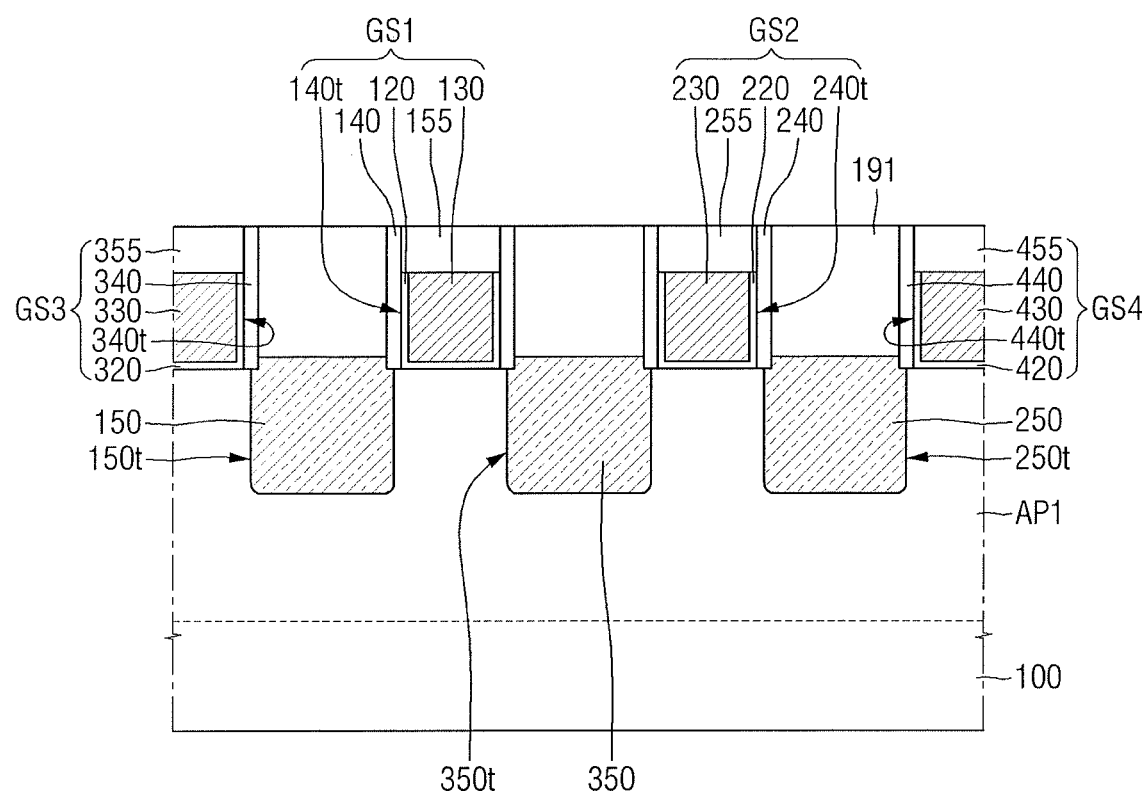

Referring to FIG. 29, first to fourth gate structures GS1, GS2, GS3 and GS4 may be formed to replace the dummy gate insulating film 520 and the dummy gate electrode 530.

For example, the dummy gate insulating film 520 and the dummy gate electrode 530 may be removed from the resultant product of FIG. 28. Subsequently, the gate insulating films 120, 220, 320 and 420, the gate electrodes 130, 230, 330 and 430, and the capping patterns 155, 255, 355 and 455 may be filled in a region from which the dummy gate insulating film 520 and the dummy gate electrode 530 are removed. As a result, first to fourth gate structures GS1, GS2, GS3 and GS4 extending in the second direction Y may be formed on the first active pattern AP1.

Figure 30:
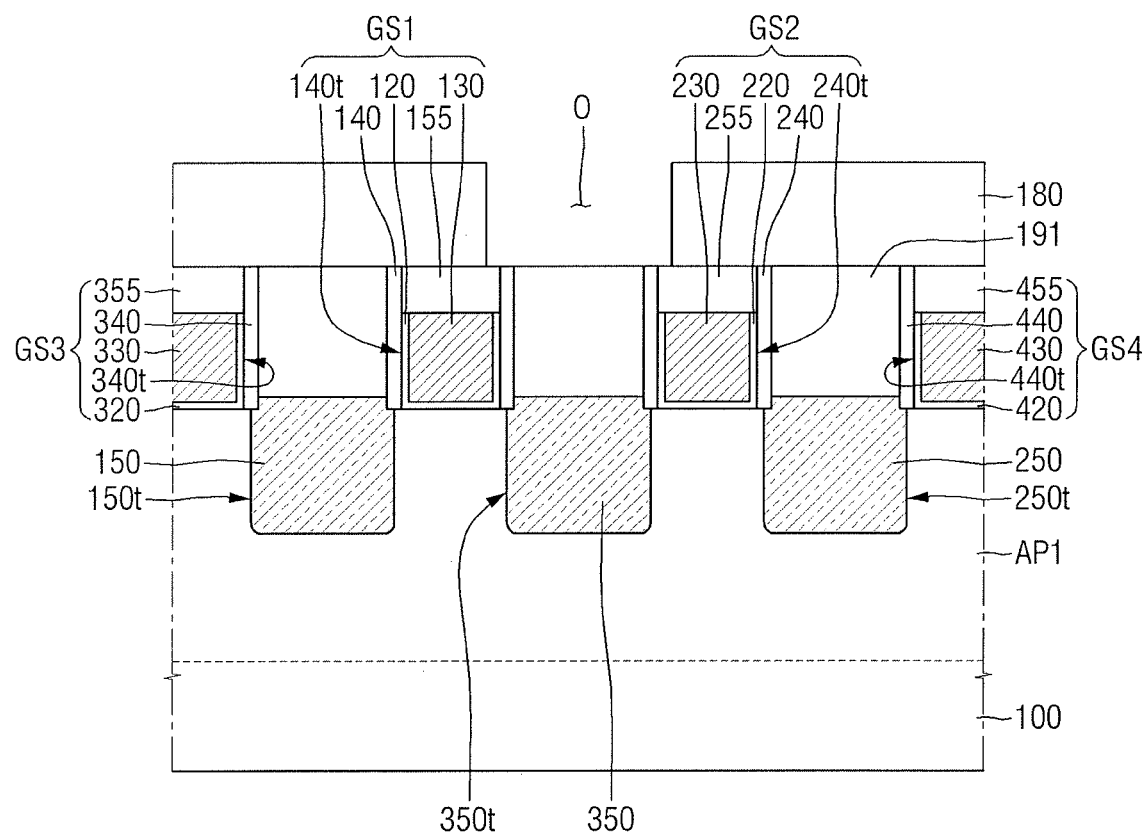

Referring to FIG. 30, a second mask pattern 180 exposing the first interlayer insulating film 191 between the first gate structure GS1 and the second gate structure GS2 may be formed.

The second mask pattern 180 may include an opening O that exposes the first interlayer insulating film 191 between the first gate structure GS1 and the second gate structure GS2. The opening O may extend, e.g., in the second direction (Y of FIG. 1).

In an implementation, the width of the opening O may be wider than the distance between the first gate structure GS1 and the second gate structure GS2. For example, a part of the first gate structure GS1 and/or a part of the second gate structure GS2 may be exposed. In an implementation, as illustrated in FIG. 30, the opening O may expose both a part of the first gate structure GS1 and/or a part of the second gate structure GS2.

Figure 31:
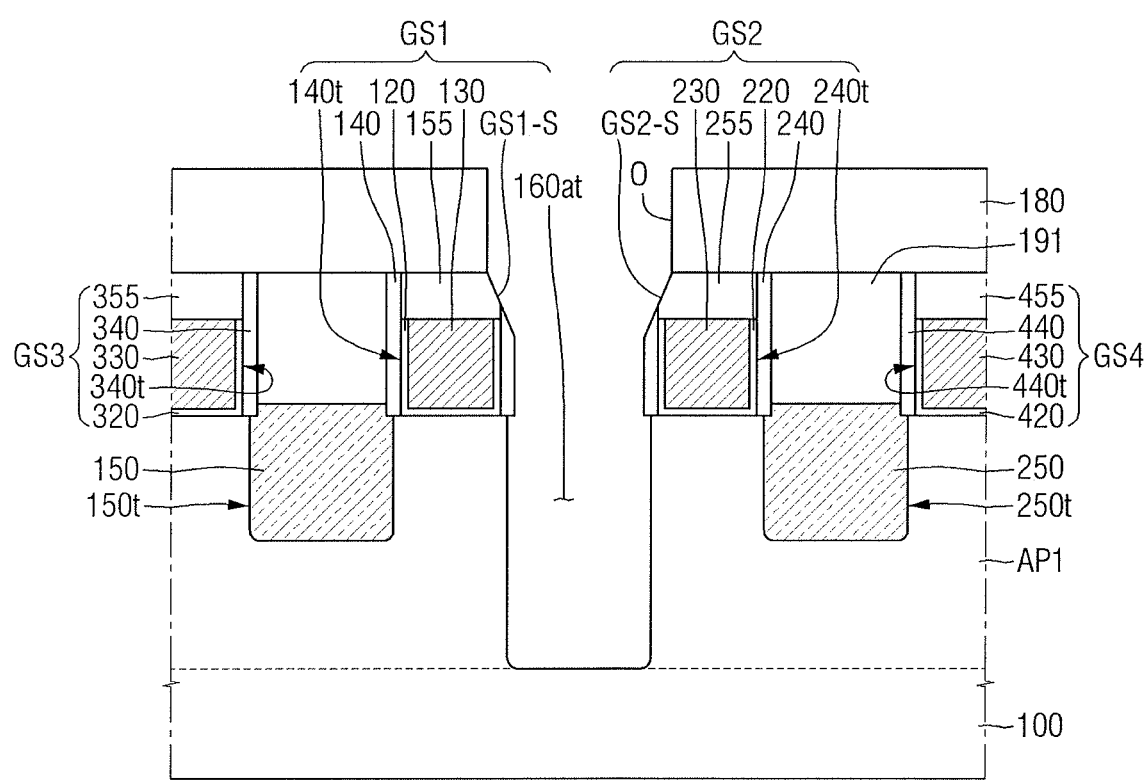

Referring to FIG. 31, a first separation trench 160*at* may be formed in the first active pattern AP1.

For example, the first interlayer insulating film 191 between the first gate structure GS1 and the second gate structure GS2, and the first active pattern AP1 may be etched, using the second mask pattern 180 as an etching mask. Accordingly, the first separation trench 160*at* may be formed in the first active pattern AP1.

In an implementation, the opening O may expose a part of the first gate structure GS1 and/or a part of the second gate structure GS2, and a part of the first gate structure GS1 and/or a part of the second gate structure GS2 may be etched. For example, the first gate structure GS1 may include a first inclined surface GS1-S, and the second gate structure GS2 may include a second inclined surface GS2-S.

Next, referring to FIGS. 1 to 4, a first device isolation film 160*a* for filling the first separation trench 160*at* may be formed.

For example, a separation film for filling the first separation trench 160*at* may be formed. Subsequently, a planarization process may be performed until the upper surfaces of the first to fourth gate structures GS1, GS2, GS3 and GS4 are exposed. As a result, the first device isolation film 160*a* between the first gate structure GS1 and the second gate structure GS2 may be formed. The second interlayer insulating film 192 may be formed to cover the first interlayer insulating film 191, the first to fourth gate structures GS1, GS2, GS3 and GS4 and the first device isolation film 160*a*.

By way of summation and review, a multi-gate transistor may use three-dimensional channels, and scaling may be easily performed. Further, even if the gate length of the multi-gate transistor is not increased, the current control capability may be improved. Furthermore, it is possible to effectively suppress SCE (short channel effect) in which the potential of the channel region is affected by the drain voltage.

One or more embodiments may provide a semiconductor device including a device isolation film between gate structures and a method for fabricating the same.

One or more embodiments may provide a semiconductor device in which degree of integration, reliability and performance of an element are improved.

One or more embodiments may provide a method for fabricating a semiconductor device capable of fabricating the semiconductor device in which the degree of integration, reliability and performance of the element are improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A method for fabricating a semiconductor device, the method comprising:
    forming an active pattern extending in a first direction on a substrate,
    forming a plurality of dummy gate electrodes spaced apart from each other and extending in a second direction intersecting the first direction, on the active pattern;
    forming an interlayer insulating film that covers side walls of the respective dummy gate electrodes;
    forming a first gate structure and a second gate structure, each extending in the second direction, in place of the plurality of dummy gate electrodes, after forming the interlayer insulating film;
    etching the interlayer insulating film and the active pattern between the first gate structure and the second gate structure to form a separation trench; and
    forming a device isolation film which fills the separation trench,
    wherein a side wall of the first gate structure facing the device isolation film includes a first inclined surface having an acute angle toward the first gate structure with respect to an upper surface of the active pattern such that a width of a portion of the first gate structure distal to the substrate is less than a width of a portion of the first gate structure proximate to the substrate, after forming the separation trench.

2. The method as claimed in claim 1, wherein forming the separation trench includes:
    forming a mask pattern that exposes the interlayer insulating film between the first gate structure and the second gate structure; and
    etching the interlayer insulating film and the active pattern between the first gate structure and the second gate structure, using the mask pattern as an etching mask.

3. The method as claimed in claim 2, wherein:
    the mask pattern includes an opening that exposes the interlayer insulating film between the first gate structure and the second gate structure, and
    the opening extends in the second direction.

4. The method as claimed in claim 3, wherein a width of the opening is wider than a distance between the first gate structure and the second gate structure.

5. The method as claimed in claim 3, wherein the opening further exposes both a part of the first gate structure and a part of the second gate structure.

6. The method as claimed in claim 1, further comprising forming a field insulating film surrounding a part of a side wall of the active pattern,
    wherein the plurality of dummy gate electrodes is formed on the active pattern and the field insulating film.

7. The method as claimed in claim 6, wherein a lowermost surface of the separation trench is lower than or substantially coplanar with an uppermost surface of the field insulating film.

8. The method as claimed in claim 1, wherein a side wall of the second gate structure facing the device isolation film includes a second inclined surface having an acute angle toward the second gate structure with respect to the upper surface of the active pattern such that a width of a portion of the second gate structure distal to the substrate is less than a width of a portion of the second gate structure proximate to the substrate, after forming the separation trench.

9. The method as claimed in claim 1, further comprising forming a first source/drain region and a second source/drain region in the active pattern,
    wherein the first gate structure is formed on the active pattern between the device isolation film and the first source/drain region, and
    the second gate structure is formed on the active pattern between the device isolation film and the second source/drain region.

10. The method as claimed in claim 1, wherein the side wall of the first gate structure and a side wall of the second gate structure directly contact the device isolation film.

* * * * *